US006246789B1

(12) United States Patent
Hosotani et al.

(10) Patent No.: US 6,246,789 B1
(45) Date of Patent: Jun. 12, 2001

(54) COMPONENT MOUNTING APPARATUS AND METHOD

(75) Inventors: Naoto Hosotani, Osaka; Koichi Morita, Nara; Shunji Onobori, Katano; Shozo Minamitani, Hirakata; Kenichi Nishino, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/143,364

(22) Filed: Aug. 28, 1998

(30) Foreign Application Priority Data

Aug. 29, 1997 (JP) ................................... 9-233497
Sep. 30, 1997 (JP) ................................... 9-267198
Oct. 20, 1997 (JP) ................................... 9-287094

(51) Int. Cl.$^7$ ........................................ G06K 9/32
(52) U.S. Cl. ........................................ 382/151
(58) Field of Search ................................... 382/145, 148, 382/151, 289, 291, 319; 348/87; 250/559.3, 559.34; 702/94, 95, 159; 356/373, 375, 399; 359/629, 630; 228/103–105

(56) References Cited

U.S. PATENT DOCUMENTS 4,899,921 * 2/1990 Bendat et al. .................... 228/105
5,667,129 * 9/1997 Morita et al. .................... 228/102
5,825,913 * 10/1998 Rostami et al. .................. 382/151
5,903,662 * 5/1999 DeCarlo ......................... 382/151

OTHER PUBLICATIONS

IBM Technical Disclosure Belletin NN881020, Optical Closed–Loop Surface–Mount Placement Procedure, Oct. 1988, vol. 31, No. 5, pp. 20–22.*

* cited by examiner

Primary Examiner—Leo Boudreau
Assistant Examiner—Brian Werner
(74) Attorney, Agent, or Firm—Wenderoth, Lind & Ponack, L.L.P.

(57) ABSTRACT

A component mounting apparatus includes a component holding and conveying device for holding and conveying a component and mounting the component onto a circuit board, a circuit board holding device for holding the circuit board, an image recognition optical system for performing recognition of the component and the circuit board with different fields of view, respectively, and a control section. The control section repeatedly determines an optical axis shift amount with the two fields of view between a position of the component and a position of the circuit board recognized by the image recognition optical system. Based on these determination results, the control section determines an optical axis shift amount for calibration, wherein calibration of the image recognition optical system is performed based on the optical-axis shift amount for calibration determined by the control section. Then, the component is mounted onto the circuit board.

28 Claims, 14 Drawing Sheets

COMPONENT MOUNTING APPARATUS AND METHOD

BACKGROUND OF THE INVENTION

The present invention relates to a component mounting apparatus and method for mounting such components as electronic components, optical components and mechanical components onto a circuit board or other member onto which the components should be mounted. More specifically, the invention relates to an improvement in the positional calibration of the component and the circuit board due to any shift of the optical axis of an image recognition optical system used in the component mounting apparatus or method.

Conventionally, in an electronic component mounting apparatus, an electronic component is mounted onto a circuit board after position recognition of the electronic component and the circuit board is executed by an image recognition optical system for enhanced mounting precision. Then, calibration operation of the image recognition optical system is performed in order to suppress any shift of the mounting position due to distortion of the image recognition optical system or the like caused by changes in environmental temperature around the electronic component mounting apparatus.

Hereinbelow, an example of the electronic component mounting apparatus according to the prior art is described with reference to FIGS. 16 and 17. Referring to FIG. 16, reference numeral 921 denotes an electronic component, which is stored on a tray 922. Reference numeral 923 denotes a head, which sucks up and conveys the electronic component 921. Reference numeral 924 denotes a circuit board, which is sucked up and held to a bonding stage 925. The bonding stage 925 and the tray 922 are fixed on a slide base 926. Reference numeral 927 denotes an image recognition optical system, which performs position recognition of the circuit board 924 and the electronic component 921. Further, the head 923 is movable in an X direction, the slide base 926 is movable in a Y direction and the image recognition optical system 927 is movable in both X and Y directions.

Referring to FIG. 17, reference numeral 928 denotes a CCD camera of the image recognition optical system 927, with a magnifying lens 929 coupled thereto. Reference numeral 930 denotes a prism frame in which a prism 931 is fixed, and the magnifying lens 929 is coupled to this prism frame 930. An image of the electronic component 921 sucked up and held to the head 923 or the circuit board 924 sucked up and held to the bonding stage 925 is taken by the CCD camera 928 via the prism 931 and the magnifying lens 929. Then, the image recognition optical system 927 takes the image of either the electronic component 921 or the circuit board 924 through a switching of the field of view.

With respect to the electronic component mounting apparatus constructed as described above, its operation is described below. First, after the head 923 and the slide base 926 have moved to specified positions, the head 923 moves down to pick up the electronic component 921 on the tray 922. Subsequently, the head 923 and the slide base 926 move again so that a coarse positioning for mounting the electronic component 921 onto the circuit board 924 is performed. Subsequently, for checking the position of the circuit board 924, the image recognition optical system 927 moves to such a position as to bring a feature point on the circuit board 924 into the field of view, performing image recognition of the feature point. Next, for checking the position of the electronic component 921, the image recognition optical system 927 moves to such a position as to bring a feature point on the electronic component 921 into the field of view, performing image recognition of the feature point. Then, position correction between the circuit board 924 and the electronic component 921 is performed based on the image recognition results of the circuit board 924 and the electronic component 921, and on an offset amount (optical-axis shift amount) between a field of view "e" on the electronic-component image recognition side and a field of view "f" on the circuit-board image recognition side which are inputted as previously measured and fixed values. After that, the head 923 moves down to mount the electronic component 921 onto the circuit board 924.

However, with the constitution as described above, even when the image-pickup positions of the electronic component 921 and the circuit board 924 have changed because of distortion of the holding portion of the image recognition optical system 927 due to changes in the room temperature or heat generation inside the apparatus so that the inclination of the optical axis has changed, the position correction would be performed based on a decision that merely the position of the electronic component 921 or the circuit board 924 has changed. As a result, the mounting position of the electronic component 921 is shifted causing change in the inclination of the optical axis.

SUMMARY OF THE INVENTION

In view of the above issues of the prior art, an object of the present invention is therefore to provide an electronic component mounting apparatus and method in which the mounting position of the electronic component does not shift even when an offset amount between fields of view on the electronic-component image recognition side and the circuit-board image recognition side has changed due to a change in the room temperature or heat generation inside the apparatus. In accomplishing these and other aspects, according to a first aspect of the present invention, there is provided a component mounting apparatus comprising a component holding and conveying device for holding and conveying a component and mounting the component onto a circuit board; a circuit board holding device for holding the circuit board; an image recognition optical system for performing position recognition of the component and the circuit board with different fields of view, respectively; and a control section for repeatedly determining an optical-axis shift amount using the two fields of view between a position of the component and a position of the circuit board recognized by the image recognition optical system. Based on those results, an optical-axis shift amount is determined for calibration.

Calibration of the image recognition optical system is performed based on the optical-axis shift amount for calibration determined by the control section, and then the component is mounted onto the circuit board.

According to a second aspect of the present invention, there is provided a component mounting apparatus according to the first aspect, wherein the control section determines the optical-axis shift amount between the two fields of view of the image recognition optical system three or more times. If a plurality of shift amounts are left after excluding an upper-limit shift amount and a lower-limit shift amount from the determined shift amounts, a mean value of the remaining shift amounts is determined and taken as the optical-axis shift amount for calibration. If only one shift amount is left after excluding the upper-limit shift amount and the lower-limit shift amount, the remaining shift amount is taken as the optical-axis shift amount for calibration. Based on the determined optical-axis shift amount for calibration, the control section performs the calibration of the image recognition optical system.

According to a third aspect of the present invention, there is provided a component mounting apparatus according to the first aspect, wherein the control section determines the optical-axis shift amount between the two fields of view of the image recognition optical system three or more times. If a difference of one shift amount from any other shift amount exceeds a threshold value, the mean value of the shift amounts except the one shift amount is determined and taken as the optical-axis shift amount for calibration (i.e., the one shift amount is dropped). Based on the determined optical-axis shift amount for calibration, the control section performs the calibration of the image recognition optical system.

According to a fourth aspect of the present invention, there is provided a component mounting apparatus according to the first aspect, wherein when the control section determines the optical-axis shift amount, images are repeatedly recognized with individual fields of view during an image capture process by the image recognition optical system. The control section determines the optical-axis shift amount between the position of the component and the position of the circuit board recognized by the image recognition optical system with the individual fields of view from among the results of the repeated recognition. Based on results of iterating this determination process a plurality of times, an optical-axis shift amount is determined for calibration. Based on the determined optical-axis shift amount for calibration, the calibration of the image recognition optical system is performed.

According to a fifth aspect of the present invention, there is provided a component mounting apparatus comprising a component holding and conveying device for holding and conveying a component and mounting the component onto a circuit board; a circuit board holding device for holding the circuit board; and an image recognition optical system for repeatedly recognizing a position of a marking of a jig with one field of view while holding the jig at the component holding and conveying device. The image recognition optical system also repeatedly recognizes a position of the marking of the jig with another field of view while holding the jig at a calibration stage of the circuit board holding device. The component mounting apparatus also comprises a control section for determining optical-axis shift amounts between the positions of the marking of the jig based on results of the repeated recognition with the two fields of view of the image recognition optical system, respectively, calculating a mean value, of the determined optical-axis shift amounts, and taking the calculated mean value as an optical-axis shift amount for calibration between the two fields of view of the image recognition optical system. After calibration of the image recognition optical system is performed based on the optical-axis shift amount for calibration determined by the control section, the component is mounted onto the circuit board.

According to a sixth aspect of the present invention, there is provided a component mounting apparatus according to the fifth aspect, wherein when repeatedly recognizing positions of the marking of the jig in each of the two states, the image recognition optical system recognizes a position of the marking of the jig that is held by the component holding and conveying device and a position of the marking of the jig that is held by the calibration stage one time each. Then the image recognition optical system iteratively recognizes the position of the marking of the jig in the respective states similarly.

According to a seventh aspect of the present invention, there is provided a component mounting apparatus according to the fifth aspect, wherein when repeatedly recognizing positions of the marking of the jig in each of the two states, the image recognition optical system repeatedly recognizes a position of the marking of the jig that is held by the component holding and conveying device, and further repeatedly recognizes a position of the marking of the jig that is held by the calibration stage.

According to an eighth aspect of the present invention, there is provided a component mounting apparatus according to the fifth aspect, wherein the image recognition optical system recognizes positions of the marking of the jig that is held by the component holding and conveying device and of the jig that is held by the calibration stage three or more times, respectively. The control section determines that if a plurality of shift amounts remain after excluding (dropping) an upper-limit shift amount and a lower-limit shift amount from the three or more shift amounts between the two fields of view determined based on results of the recognition, a mean value of the remaining shift amounts is determined and taken as the optical-axis shift amount for calibration. If only one shift amount is left after excluding the upper-limit shift amount and the lower-limit shift amount, the remaining shift amount is taken as the optical-axis shift amount for calibration instead of determining the mean value.

According to a ninth aspect of the present invention, there is provided a component mounting apparatus according to the fifth aspect, wherein the image recognition optical system recognizes positions of the marking of the jig that is held by the component holding and conveying device and of the jig that is held by the calibration stage three or more times, respectively. The control section determines that if a difference of one shift amount from any other shift amount exceeds a threshold value, a mean value of shift amounts except the one shift amount is determined (i.e., the one shift amount is dropped) and taken as the optical-axis shift amount for calibration.

According to a tenth aspect of the present invention, there is provided a component mounting method comprising repeatedly recognizing a position of a marking of a jig by an image recognition optical system while the jig is held by a component holding and conveying device which holds and conveys a component and then mounting the component onto a circuit board; and repeatedly recognizing a position of the marking of the jig by the image recognition optical system while the jig is held by a calibration stage of a circuit-board holding device which holds the circuit board.

The method also comprises determining an optical-axis shift amount between the positions of the marking of the jig between the two fields of view of the image recognition optical system; and calculating a mean value of the determined optical-axis shift amounts and taking the mean value as an optical-axis shift amount between the two fields of view of the image recognition optical system. After performing calibration based on this optical-axis shift amount, the component is then mounted onto the circuit board.

According to an eleventh aspect of the present invention, there is provided a component mounting method according to the tenth aspect, wherein when the positions of the marking of the jig in the two states are repeatedly recognized by the image recognition optical system, the position of the marking of the jig that is held by the component holding and conveying device and the position of the marking of the jig that is held by the calibration stage are recognized by the image recognition optical system one time each. Then the positions of the marking of the jig in the respective states are similarly recognized.

According to a twelfth aspect of the present invention, there is provided a component mounting method according to the tenth aspect, wherein when the positions of the marking of the jig in the two states are repeatedly recognized by the image recognition optical system, the position of the marking of the jig that is held by the component holding and conveying device is repeatedly recognized by the image recognition optical system, and the position of the jig that is held by the calibration stage is repeatedly recognized by the image recognition optical system.

According to a thirteenth aspect of the present invention, there is provided a component mounting method according to the tenth aspect, wherein positions of the marking of the jig that is held by the component holding and conveying device and of the jig that is held by the calibration stage are recognized three or more times, respectively. If a plurality of shift amounts are left after excluding an upper-limit shift amount and a lower-limit shift amount from the three or more shift amounts between the two fields of view determined based on recognition results, a mean value of the remaining shift amounts is determined and taken as the optical-axis shift amount for calibration. If only one shift amount is left after excluding the upper-limit shift amount and the lower-limit shift amount, the remaining shift amount is taken as the optical-axis shift amount for calibration instead of determining the mean value. Then the calibration is performed based on the determined optical-axis shift amount for calibration.

According to a fourteenth aspect of the present invention, there is provided a component mounting method according to the tenth aspect, wherein positions of the marking of the jig that is held by the component holding and conveying device and of the jig that is held by the calibration stage are recognized three or more times, respectively. If a difference of one shift amount from any other shift amount exceeds a threshold value, a mean value of shift amounts except the one shift amount is determined and taken as the optical-axis shift amount for calibration. Then calibration is performed based on the determined optical-axis shift amount for calibration.

According to a fifteenth aspect of the present invention, there is provided a component mounting apparatus according to the first aspect, wherein the control section determines an optical-axis shift amount with the two fields of view between the position of the component and the position of the circuit board repeatedly recognized by the image recognition optical system with specified time intervals. Based on the results of the determination, the optical-axis shift amount for calibration is determined.

According to a sixteenth aspect of the present invention, there is provided a component mounting method according to the tenth aspect, wherein when the repeated recognition is performed by the image recognition optical system, the recognition is repeatedly performed with specified time intervals.

According to a seventeenth aspect of the present invention, there is provided a component mounting apparatus comprising a component holding and conveying device for holding and conveying a component and mounting the component onto a circuit board; a circuit board holding device for holding the circuit board; an image recognition optical system for performing position recognition of the component and the circuit board with different fields of view, respectively; and a control section for determining an optical-axis shift amount with the two fields of view between a position of the component and a position of the circuit board recognized by the image recognition optical system. Based on the determination results, an optical-axis shift amount is determined for calibration. After correcting a mounting position of the component relative to the circuit board based on the determined optical-axis shift amount, the component is mounted.

The control section exerts control so that the calibration operation of the image recognition optical system is performed during the holding of the circuit board to the circuit board holding device.

According to an eighteenth aspect of the present invention, there is provided a component mounting apparatus according to the seventeenth aspect, further comprising a calibration stage on which a jig for calibration of the image recognition optical system is to be placed. For feeding the circuit board, the calibration stage moves so that the jig for calibration of the image recognition optical system is located at such a position so as to be recognizable for the image recognition optical system.

The position of the jig placed on the calibration stage is recognized by the image recognition optical system. Thus, the position recognition of the circuit board is achieved, and the position of the jig resulting when the jig on the calibration stage is held by the component holding and conveying device is recognized by the image recognition optical system. As a result, the position recognition of the component is achieved.

According to a nineteenth aspect of the present invention, there is provided a component mounting apparatus according to the seventeenth aspect, further comprising a calibration stage on which a jig for calibration of the image recognition optical system is to be placed. For feeding the circuit board, the calibration stage moves so that the jig for calibration of the image recognition optical system is located at such a position to be holdable for the component holding and conveying device.

The position of the jig placed on the calibration stage is recognized by the image recognition optical system. Thus, the position recognition of the circuit board is achieved, and the position of the jig resulting when the jig on the calibration stage is held by the component holding and conveying device is recognized by the image recognition optical system, whereby the position recognition of the component is achieved.

According to a twentieth aspect of the present invention, there is provided a component mounting apparatus according to the seventeenth aspect, wherein the control section exerts control so that the image recognition for calibration of the image recognition optical system is not performed while a circuit board conveying device is moving.

According to a twenty-first aspect of the present invention, there is provided a component mounting apparatus according to the seventeenth aspect, wherein the control section exerts control for picking up the circuit board by the circuit board conveying device, and concurrently performing image recognition of the jig on the calibration stage for calibration by the image recognition optical system.

After completion of the foregoing two operations, the control section controls movement of the circuit board conveying device toward the circuit board holding device, and makes the jig get picked up by the component holding and conveying device.

Thereafter, the control section controls the mounting of the circuit board held by the circuit board conveying device onto the circuit board holding device, and concurrently controls performance of the image recognition of the jig held by the component holding device for calibration by the image recognition optical system.

According to a twenty-second aspect of the present invention, there is provided a component mounting method comprising holding a circuit board by a circuit board holding device, and concurrently performing position recognition of a component held by a component holding and conveying device for calibration with one field of view by an image recognition optical system; and performing position recognition of the circuit board held by the circuit board holding device for calibration with a field of view different from the foregoing field of view by the image recognition optical system. An optical-axis shift amount is determined with the two fields of view between the position of the component and the position of the circuit board recognized by the image recognition optical system, and an optical-axis shift amount is determined for calibration based on the determination results. After correcting a mounting position of the component relative to the circuit board based on the determined optical-axis shift amount, the component is mounted.

According to a twenty-third aspect of the present invention, there is provided a component mounting method according to the twenty-second aspect, further comprising moving, when the circuit board is held by the circuit board holding device, a jig for calibration of the image recognition optical system which is placed on a calibration stage. Thus, the jig for calibration of the image recognition optical system is located at such a position as to be recognizable for the image recognition optical system.

According to a twenty-fourth aspect of the present invention, there is provided a component mounting method according to the twenty-second aspect, further comprising moving a jig for calibration of the image recognition optical system which is placed on a calibration stage, when the circuit board is held by the circuit board holding device. Therefore, the jig for calibration of the image recognition optical system is located at such a position so as to be holdable for the component holding and conveying device.

According to a twenty-fifth aspect of the present invention, there is provided a component mounting method according to the twenty-second aspect, wherein the image recognition for calibration of the image recognition optical system is not performed while the circuit board conveying device is moving.

According to a twenty-sixth aspect of the present invention, there is provided a component mounting method according to the twenty-fifth aspect, further comprising making the circuit board get picked up by the circuit board conveying device, and concurrently performing image recognition of a jig for calibration of the image recognition optical system.

After completion of the foregoing two operations, the circuit board conveying device is moved toward the circuit board holding device, and the jig is picked up by the component holding and conveying device. Thereafter, the circuit board held by the circuit board conveying device is mounted onto the circuit board holding device, and image recognition of the jig held by the component holding device is concurrently performed.

According to a twenty-seventh aspect of the present invention, there is provided a component mounting apparatus according to the eighteenth aspect, wherein the calibration stage is located at a deep-side end edge of a slide base in a circuit board holding device which holds the circuit board. The deep-side end edge is a region that will not obstruct conveying-in and -out operations of the circuit board.

According to a twenty-eighth aspect of the present invention, there is provided a component mounting apparatus comprising a component holding and conveying device for holding and conveying a component, and for mounting the component onto a circuit board; a circuit board holding device for holding the circuit board; and an image recognition optical system for recognizing a position of a marking of a jig with one field of view while holding the jig at the component holding and conveying device. The image recognition optical system also recognizes a position of the marking of the jig with another field of view while holding the jig at a calibration stage of the circuit board holding device. The apparatus further comprises a control section for determining an optical-axis shift amount between the positions of the marking of the jig based on the recognition result with the two fields of view of the image recognition optical system, which is taken as an optical-axis shift amount for calibration between the two fields of view of the image recognition optical system. After calibration of the image recognition optical system is performed based on the optical-axis shift amount for calibration determined by the control section, the component is mounted onto the circuit board.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
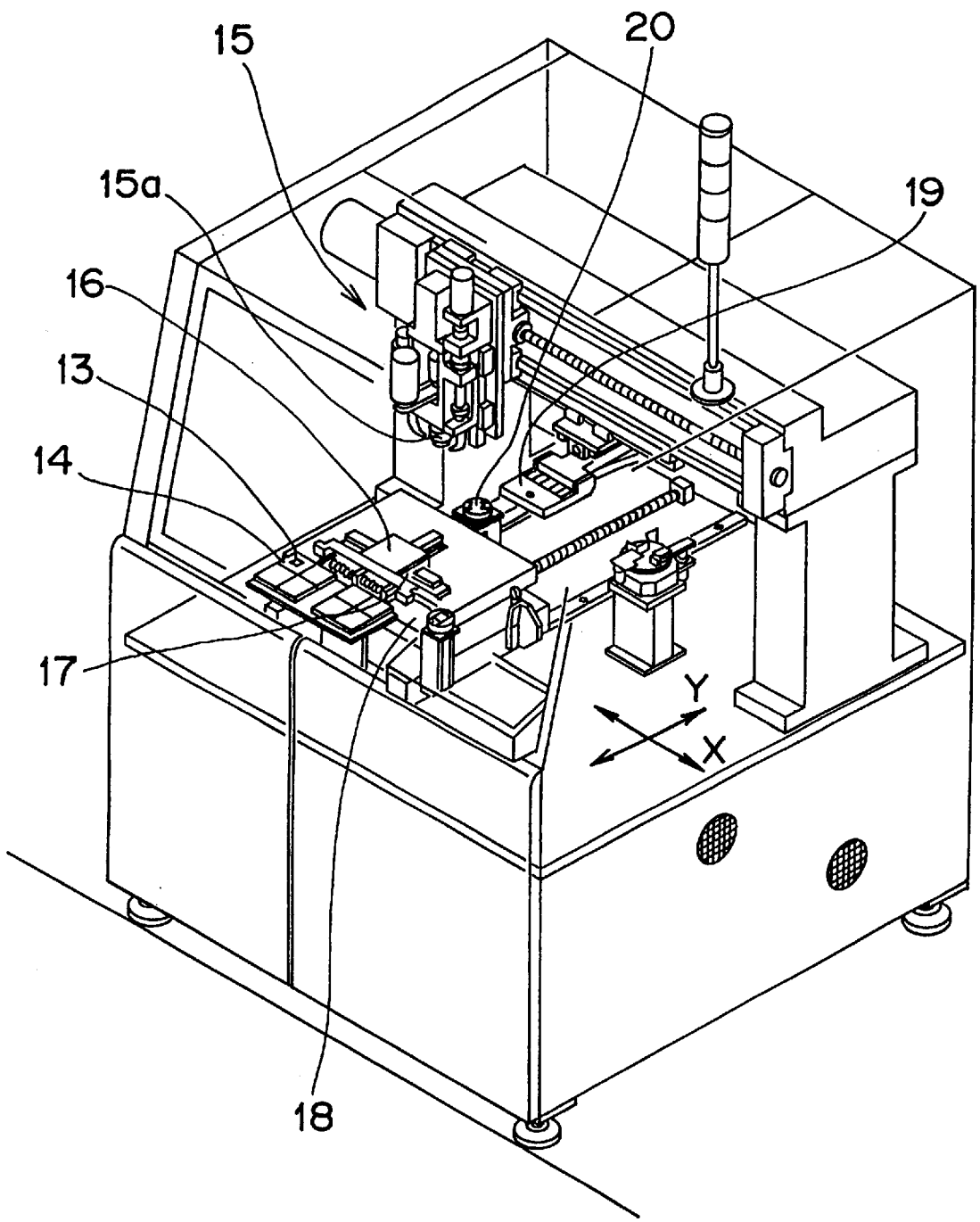
FIG. 1 is a perspective view showing the overall arrangement of an electronic component mounting apparatus according to a first embodiment of the present invention.

Before the description of the present invention proceeds, it is to be noted that like parts are designated by like reference numerals throughout the accompanying drawings.

Hereinbelow, an electronic component mounting apparatus and method as an example of component mounting apparatus and method according to a first embodiment of the present invention are described with reference to the accompanying drawings.

Figure 2:
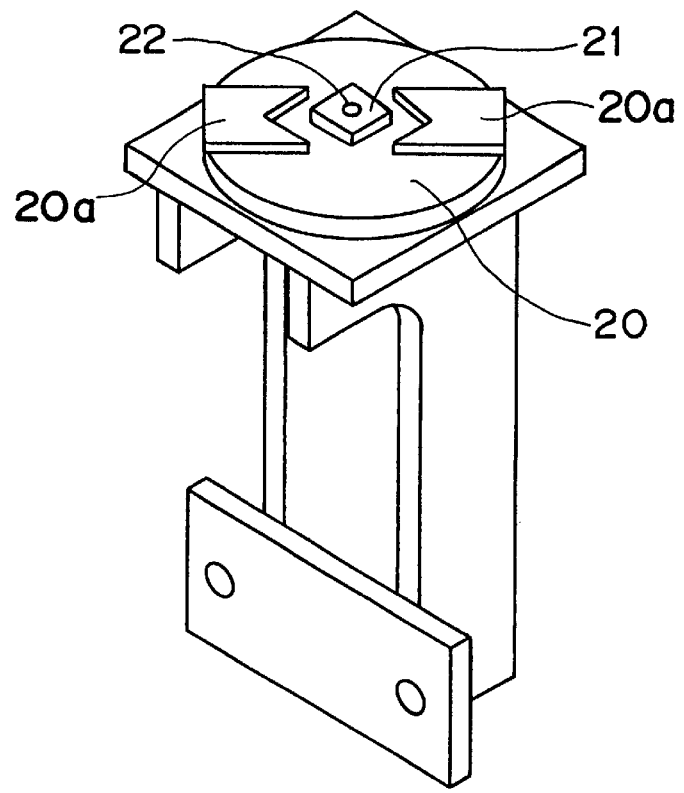
FIG. 2 is a perspective view of the calibration stage in the state in which a jig is placed in the electronic component mounting apparatus of FIG. 1.

FIG. 1 is a perspective view of the electronic component mounting apparatus which carries out the electronic component mounting method in the first embodiment of the present invention. FIG. 2 is a perspective view of the calibration stage of the image recognition optical system.

Referring to FIG. 1, reference numeral 13 denotes an electronic component, as an example of a component to be mounted, which is stored on a tray 14. Reference numeral 15 denotes a bonding head as an example of an electronic-component holding and conveying device. The bonding head 15 can move in an X direction and can move up and down in a Z direction perpendicular to the X direction and a Y direction. Furthermore, the bonding head is operable to vacuum suck up the electronic component 13 with a nozzle 15a and handle it. Denoted by reference numeral 16 is a circuit board which is an example of a member onto which the electronic component 13 is to be mounted, the circuit board 16 being sucked up and held to a bonding stage 17 as an example of a circuit-board holding device. Then, the bonding stage 17 and the tray 14 are fixed on a slide base 18 which can move in the Y direction. Reference numeral 19 denotes an image recognition optical system, which can recognize the position of the circuit board 16 located below the image recognition optical system 19 and the position, of the electronic component 13 sucked up above the image recognition optical system 19 by the bonding head 15, whichever it is, by switching over the upper and lower fields of view. Also, the image recognition optical system 19 is movable in both X and Y directions. Reference numeral 20 denotes a calibration stage, which is fixed on the slide base 18.

Referring to FIG. 2, a jig 21 made of glass for calibration of the optical system is sucked up and held on the top of the calibration stage 20 while being positioned by a pair of position regulating claws 20a, 20a. Also, a marking 22 for image recognition is marked at a center portion of the jig 21.

Figure 6:
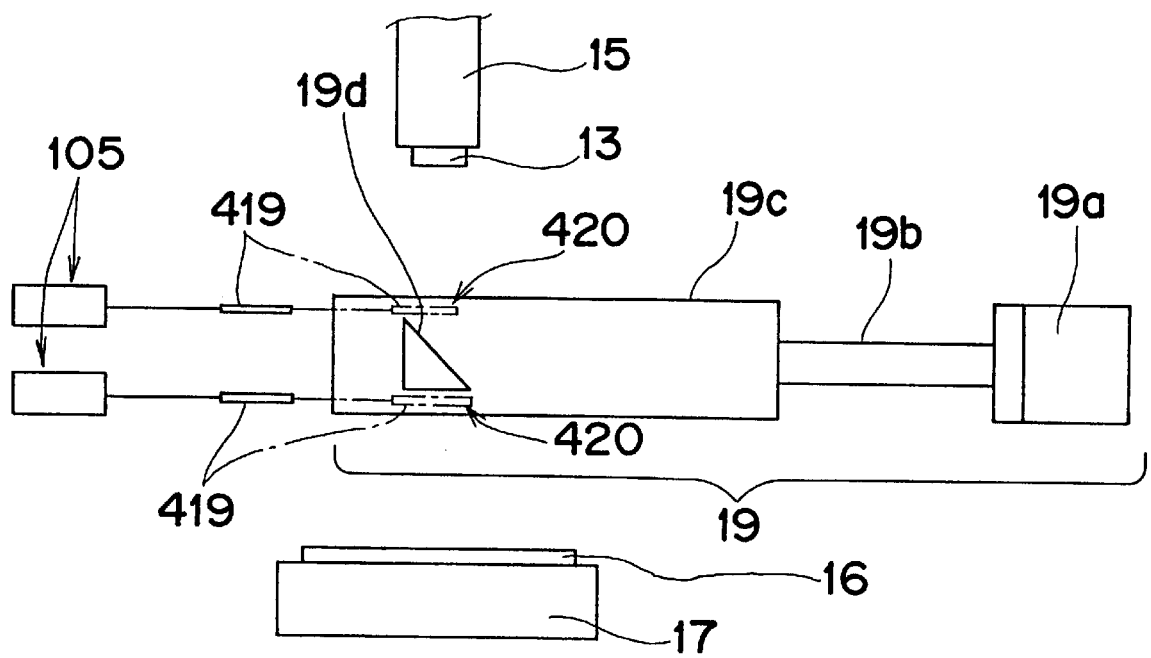
FIG. 6 is a longitudinal side view of the image recognition optical system in the first embodiment of the present invention.
Figure 7:
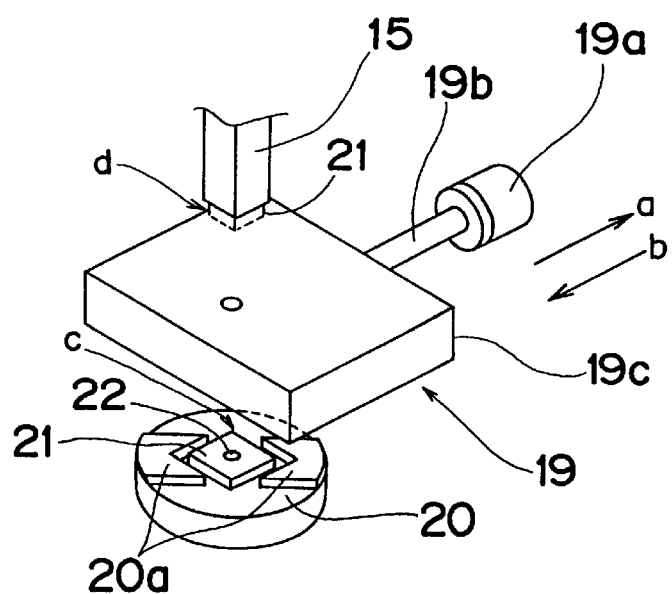
FIG. 7 is a perspective view showing the calibration operation in the first embodiment.

FIG. 6 shows in detail the image recognition optical system 19. Reference numeral 19a denotes a CCD camera, with a magnifying lens 19b coupled thereto. Reference numeral 19c denotes a prism frame in which a prism 19d is fixed, and the magnifying lens 19b is coupled to this prism frame 19c. An image of the electronic component 13 sucked up and held to the bonding head 15 or the circuit board 16 sucked up and held to the bonding stage 17 is taken by the CCD camera 19a via the prism 19d and the magnifying lens 19b. Then, the image recognition optical system 19 takes the image of either the electronic component 13 or the circuit board 16 by switching the field of view. In FIG. 6, reference numeral 419 denotes upper and lower shutters which are for switching between upper and lower fields of view and which are driven by shutter driving units 105. For a switching to the upper field of view, the lower shutter 419 is moved to a position 420 in the figure so as to shield the lower field of view while the upper shutter 419 is moved to a retreat position, allowing only the upper field of view to be recognized by the image recognition optical system 19. Meanwhile, for a switching to the lower field of view, the upper shutter 419 is moved to a position 420 in the figure so as to shield the upper field of view while the lower shutter 419 is moved to a retreat position, allowing only the lower field of view to be recognized by the image recognition optical system 19. The drive of these two shutters 419 is controlled by a main controller 101.

With respect to the electronic component mounting apparatus constructed as described above, its operation is explained below.

Figure 4:
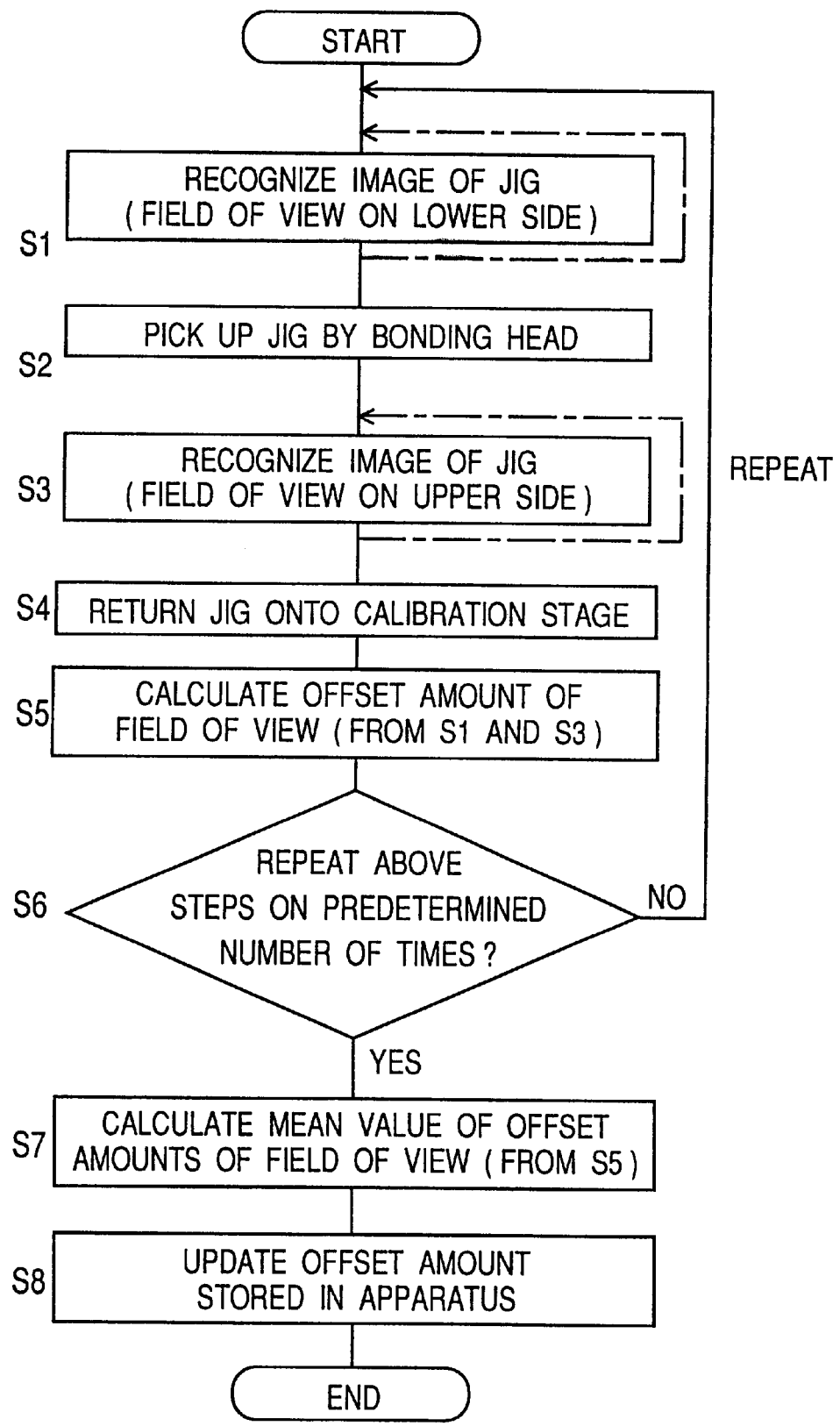
FIG. 4 is a flow chart of the calibration operation of the electronic component mounting apparatus of FIG. 1.

For mounting the electronic component 13 onto the circuit board 16, a calibration operation of the optical system is first executed. The operation is described from now on. FIG. 4 is a flow chart of calibration operation for the image recognition optical system 19.

In the calibration operation, first, the image recognition optical system 19 moves in the X direction or the Y direction so that the marking 22 of the jig 21 on the calibration stage 20 fixed to the slide base 18 becomes recognizable for the image recognition optical system 19. Subsequently, the field of view of the image recognition optical system 19 is switched from the upper side to the lower side, and the position recognition of the marking 22 of the jig 21 mounted on the calibration stage 20 is performed (step S1 in FIG. 4) so as to recognize a circuit board calibration position.

Next, the image recognition optical system 19 withdraws (is retreated) backward with respect to the slide base 18, i.e., obliquely upward and rightward in the Y direction in FIG. 1. After this, the bonding head 15 moves down to pick up the jig 21 on the calibration stage 20 (step S2 in FIG. 4).

Next, the field of view of the image recognition optical system 19 is switched to the upper side, and the image recognition optical system 19 moves forward, i.e., obliquely downward and leftward in the Y direction in FIG. 1, where the position recognition of the marking 22 of the jig 21 is performed again (step S3 in FIG. 1) so as to recognize a component calibration position. The jig 21 is made of glass and previous to light, so that the same marking 22 can be recognized by the upper and lower fields of view, respectively.

Next, after the image recognition optical system 19 has withdrawn backward, the bonding head 15 moves down to mount the jig 21 onto the calibration stage 20 (step S4 in FIG. 1). Then, based on the individual recognition results, an optical-axis shift amount (offset amount) between the upper and lower fields of view of the image recognition optical system 19 is determined (step S5 in FIG. 5). This is explained in detail with reference to FIG. 3.

Figure 3:
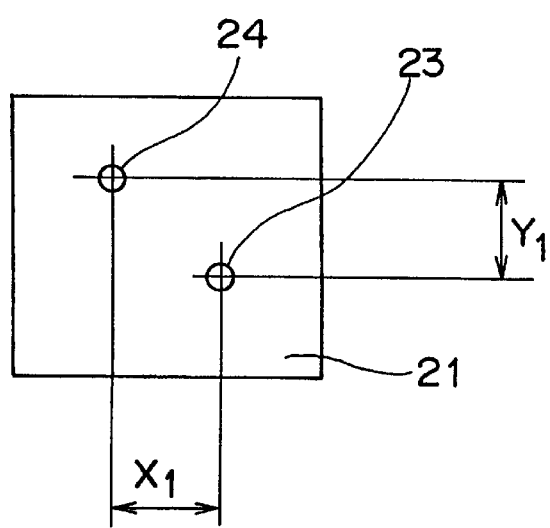
FIG. 3 is a view representing positions of images of the jig taken with the upper and lower fields of view of the image recognition optical system of the electronic component mounting apparatus of FIG. 1.

FIG. 3 represents positions of the marking 22 on the jig 21 taken by the image recognition optical system 19 where 23 represents a position of the marking 22 resulting from recognizing an image of the marking 22 with the lower field of view, and 24 represents a position of the marking 22 resulting from recognizing an image of the marking 22 with the upper field of view of the image recognition optical system 19. Distances X1 and Y1 between the marking 23 and the marking 24 in this case represent an optical-axis shift amount between the lower field of view and the upper field of view of the image recognition optical system 19. This optical-axis shift amount between the fields of view would subtly vary due to the occurrence of distortion of the image recognition optical system 19 etc. caused by effects of changes in the environmental temperature around the electronic component mounting apparatus. Unless the optical-axis shift amount between the fields of view stored in the electronic component mounting apparatus is corrected, there would occur a shift in the mounting position corresponding to the temperature change.

Next, the measurement of the optical-axis shift amount between the fields of view is repeatedly performed a plurality of times (step S6 in FIG. 4), and a mean value among the optical-axis shift amounts between the fields of view is determined (step S7 in FIG. 4). This is because one-time measurement would be greatly affected by the handling precision of the jig 21 so that the optical-axis shift amount could not be measured with high precision. Subsequently, for prevention of any shift in the mounting position, the optical-axis shift amount between the fields of view stored in the electronic component mounting apparatus is updated, in which process the amount is updated with an optical-axis shift amount for calibration use determined as the above mean value (step S8 in FIG. 4).

In this connection, as the method for achieving the measurement with enhanced calibration precision, the following ① to ① methods are available:

① The measurement of the optical-axis shift amount is performed three or more times at step S6 in order to suppress any effect of the handling precision of the jig 21. A mean value of measured values is determined, excluding the upper-limit measured value and the lower-limit measured value, at step S7. The determined mean value is used as a calibration result, i.e., an optical-axis shift amount for calibration use, at step S8. In addition, when only one measured value is left after excluding the upper-limit measured value and the lower-limit measured value, the one measured value remaining is used as an optical-axis shift amount for calibration use.

② The measurement of the optical-axis shift amount is performed three or more times at step S6 in order to suppress any effect of the handling precision of the jig 21. At step S7, if a measured value, even when subtracted from the other measured values, results in a difference larger than a threshold value, the mean value of measured values is determined, excluding the aforementioned measured value at step S7. The determined mean value is used as a calibration result, i.e., an optical-axis shift amount for calibration use, at step S8.

③ a For the measurement of the position of the marking 22 of the jig 21 under the image pickup with the upper and lower fields of view for enhanced recognition precision, image recognition of the marking 22 is repeatedly performed a plurality of times (see flows in one-dot chain line at steps S1 and S3 in FIG. 4). The position of the marking 22 is determined at step S5 based on the plurality of recognition results.

In particular, adopting the ① and ② methods makes it possible to eliminate any effect of an abrupt, large shift of the jig 21 during the handling of the jig 21, as it may arise on rare occasions.

Referring now to a control section 200 relating to the calibration operation of the image recognition optical system 19, its construction and the operation flow are explained in more detail with reference to FIGS. 4 and 5.

In the first place, the construction of the control section 200 provided in the electronic component mounting apparatus is explained.

Figure 5:
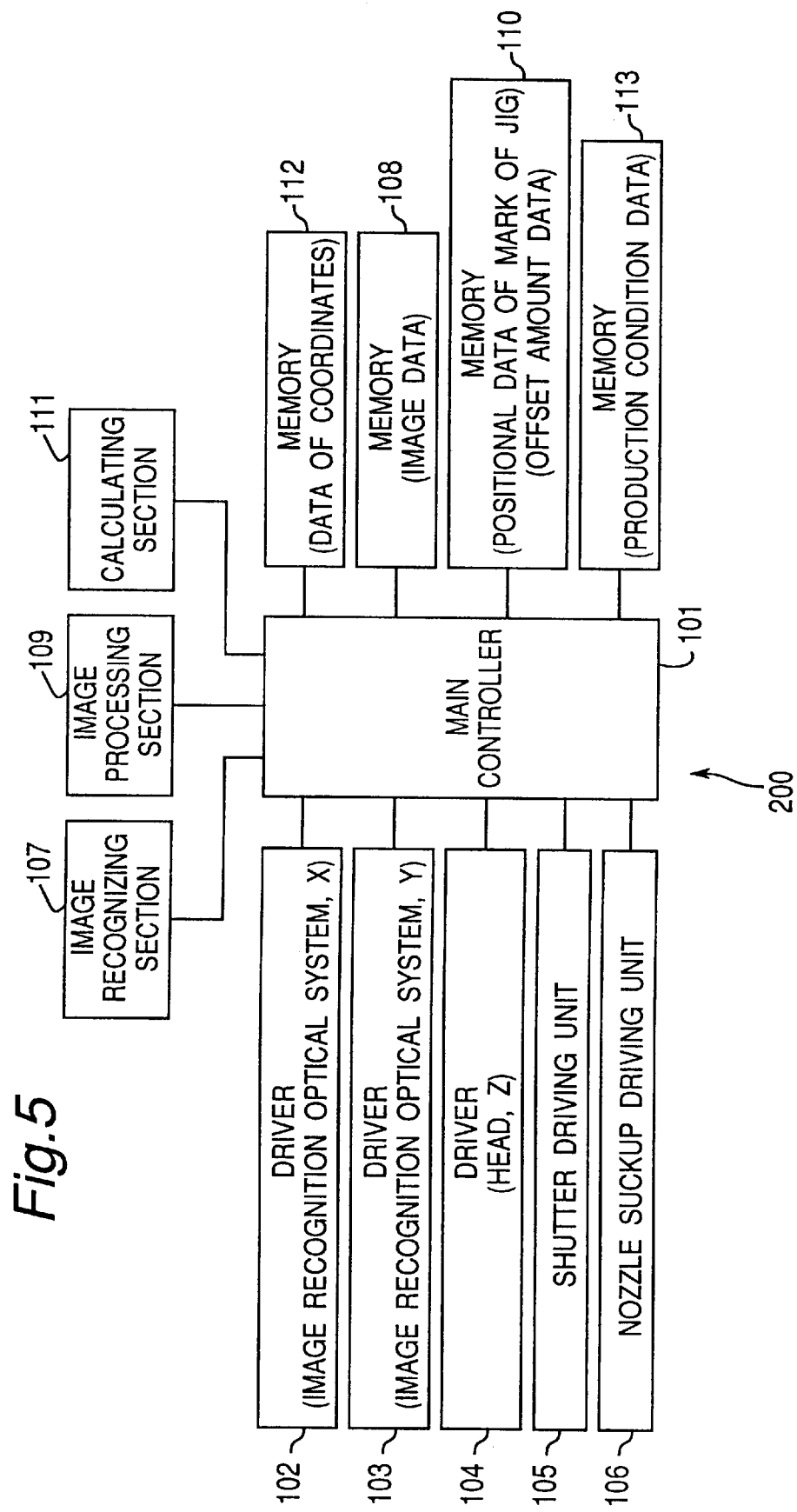
FIG. 5 is a block diagram showing the arrangement of the control section of the electronic component mounting apparatus of FIG. 1.

Referring to FIG. 5, reference numeral 101 denotes a main controller of the control section 200 that controls the whole electronic component mounting apparatus. The main controller 101 issues operation instructions and calculation instructions and puts data into and out of memories according to a concatenated control sequence. Reference numerals 102, 103, 104 denote motor drivers, which correspond to a motor for moving the image recognition optical system 19 in the X direction, a motor for moving the image recognition optical system 19 in the Y direction and a motor for moving the bonding head 15 in the Z (vertical) direction, respectively. Drivers corresponding to other motors are omitted in this figure. Reference numeral 105 denotes shutter driving units such as motors or air cylinders, which drive the shutters 419 for switching between the upper and lower fields of view of the image recognition optical system 19. Reference numeral 106 denotes a nozzle suction driver, which performs the on-off switching of the suction of the suction nozzle 15a of the bonding head 15. Reference numeral 107 denotes an image recognizing section, which captures the marking 22 of the jig 21 for calibration use as image data by the image recognition optical system 19. Then, the captured image data is stored in a memory 108. Reference numeral 109 denotes an image processing section, which determines the position of the target, i.e., the marking 22, from the image data stored in the memory 108. The positional data of the marking 22 is stored in a memory 110. Reference numeral 111 denotes a calculating section, which calculates an optical-axis shift amount (offset amount) from the position of the marking 22 of the jig 21 stored in the memory 110. Then, the calculated optical-axis shift amount is stored in the memory 110. Also, data of target coordinates for the movement of respective motor drive shafts have been stored in a memory 112. Production conditions for producing the circuit board 16 on which the electronic components 13 are mounted have been stored in a memory 113.

Next the control flow is described. First, the main controller 101 reads from the memory 112 the X- and Y-coordinates stored in the memory 112 to which the image recognition optical system 19 should be moved to recognize the image of the marking 22 of the jig 21 on the calibration stage 20, and issues instructions to the drivers 102, 103 so that the image recognition optical system 19 moves to the X- and Y-coordinates. Then, the image recognition optical system 19 moves to the X- and Y-coordinates. Subsequently, the main controller 101 issues an instruction to the shutter driving unit 105 to make the field of view of the image recognition optical system 19 switched to the lower side, thus switching the shutter 491 to the lower side one as previously described. Subsequently, the main controller 101 issues an instruction to the image recognizing section 107 to capture an image, thus making an image of the marking 22 of the jig 21 on the calibration stage 20 captured by the image recognition optical system 19, and further storing the captured image data into the memory 108. Subsequently, the main controller 101 issues an instruction for image processing to the image processing section 109, so that the image processing section 109 calculates a position 22-1 of the marking 22 of the jig 21 from the above image data stored in the memory 110, storing it into the memory 110. The processes up to this point are the operation of step S1 in FIG. 4.

Next in order that the image recognition optical system 19 withdraws up to the rear X- and Y-coordinates stored in the memory 112, the main controller 101 reads from the memory 112 the X- and Y-coordinates to which the image recognition optical system 19 should move backward, and then issues instructions for the drivers 102, 103 to move backward to the X- and Y-coordinates. Thus, the image recognition optical system 19 is moved backward up to the X- and Y-coordinates.

Next, the main controller 101 reads from the memory 112 a Z coordinate which is stored in the memory 112 and to which the bonding head 15 should move down to pick up the jig 21 on the calibration stage 20, and issues an instruction to the driver 104 so that the bonding head 15 moves to the Z-coordinate, thus the bonding head 15 moving down. Subsequently, the main controller 101 issues an instruction for the nozzle suckup driver 106 to turn on the vacuum for the jig 21 by the nozzle 15a, so that the jig 21 is sucked up by the nozzle 15a of the bonding head 15. Subsequently, the main controller 101 issues an instruction for the driver 104 to move to the coordinate origin, thus the nozzle 15a of the bonding head 15 moves up. The processes up to this point are the operation of step S2 in FIG. 4.

Next, the main controller 101 issues an instruction for the shutter driving unit 105 to switch the field of view of the image recognition optical system 19 to the upper side one, thereby switching the shutter from the lower side to the upper side as previously described. Subsequently, the main controller 101 issues an instruction for the image recognizing section 107 to capture an image, so that an image of the marking 22 of the jig 21 sucked up by the nozzle 15a of the bonding head 15 is captured by the image recognition optical system 19, thus storing image data into the memory 108. Subsequently, the main controller 101 issues an instruction for the image processing section 109 to perform image processing, so that the image processing section 109 calculates a position 22-2 of the marking 22 of the jig 21 from the image data stored in the memory 108, thus storing it into the memory 110. The processes up to this point are the operation of step S3 in FIG. 4.

Next, the main controller 101 issues an instruction for the calculating section 111 to determine an optical-axis shift amount between the upper and lower fields of view, i.e., an offset amount, of the image recognition optical system 19, so that the calculating section 111 calculates the optical-axis shift amount by performing calculations from the position 22-1 of the marking 22 of the jig 21 and the position 22-2 of the marking 22 of the jig 21 stored in the memory 110, storing the calculated optical-axis shift amount into the memory 110. This operation is the optical-axis shift amount calculating operation of step S5. This operation of step S5 may be done after the operation of returning the jig 21 to the calibration stage 20 at step S4 as shown in FIG. 4, whereas the operation may also be done before the operation of step S4. Otherwise, the steps S4 and S5 may be performed simultaneously.

Next, the main controller 101 reads the X- and Y-coordinates stored in the memory 112 to which the image recognition optical system 19 should be moved to withdraw backward, and issues an instruction for the drivers 102, 103 to move to the coordinates, so that the image recognition optical system 19 moves to the coordinates.

Next, the main controller 101 reads from the memory 112 the Z-coordinate stored in the memory 112 to which the nozzle 15a of the bonding head 15 should be moved down to release the jig 21 on the calibration stage 20, and issues an instruction for the driver 104 to move the nozzle 15a of the bonding head 15 down to the Z-coordinate, so that the nozzle 15a of the bonding head 15 moves down to the Z-coordinate. Subsequently, the main controller 101 issues an instruction for the nozzle suckup driving unit 106 to turn off the vacuum for the jig 21 by the nozzle 15a, thus stopping the suckup of the jig 21 by the nozzle 15a of the bonding head 15, and returning the jig 21 onto the calibration stage 20. Subsequently, the main controller 101 issues an instruction to the driver 104 for the nozzle 15a of the bonding head 15 to move up to the coordinate origin, so that the nozzle 15a of the bonding head 15 moves up to the coordinate origin. These processes are the operation of step S4.

Then, based on the optical-axis shift amounts measured and stored in the memory 108, as shown in step S7, a mean value of the optical-axis shift amounts to be used for calibration is determined by the calculating section 111 in the following manner.

If it is set in the memory 113 that the measurement of optical-axis shift amount is to be performed three or more times and that the upper- and lower-limit measured values are excluded, a mean value of optical-axis shift amounts is determined with the remaining measured values after excluding the upper-limit measured value and the lower-limit measured value as invalid. The resulting mean value is then stored in the memory 110 as the calibration result, i.e., the optical-axis shift amount for calibration use. In addition, when only one measured value is left after excluding the upper-limit measured value and the lower-limit measured value over three times of measurement, the one measured value is used for calibration as an optical-axis shift amount for calibration use.

Otherwise, in the case where a threshold value for variations in the optical-axis shift amount is set in the memory 113, differences between the measured values are calculated by subtracting one measured value from the other measured values. If the difference between a measured value and any of the other measured values is greater than the threshold value, a mean value of the measured values is determined, excluding the aforementioned measured value. The determined mean value is then stored in the memory 110 as an optical-axis shift amount for calibration use.

Also, without the setting for the exclusion of the upper- and lower-limit measured values, and without the setting of a threshold value, a mean value of optical-axis shift amounts is determined from all the measured values of the optical-axis shift amounts. The determined mean value is then stored in the memory 110 as an optical-axis shift amount for calibration use.

Also, when the number of recognition times is set in the memory 113, an image capturing process is performed continuously the set number of times as shown by one-dot chain line at steps S1 and S3 in FIG. 4 in the capturing of the image of the marking 22 of the jig 21. Then, mean values among a plurality of positions of the marking 22 of the jig 21 determined from a plurality of image data are determined, respectively, and the determined mean values are stored in the memory 110 as the positions 22-1, 22-2 of the marking 22 of the jig 21 and used to calculate the optical-axis shift amounts between the fields of view, respectively.

Next, the operation of mounting the electronic component 13 onto the circuit board 16 is performed. This operation is described below.

First, in order that the image recognition optical system 19 can check the position of the circuit board 16 on the bonding stage 17 mounted on the slide base 18, the slide base 18 and the image recognition optical system 19 are moved under the control of the main controller 101. For this process, feature points for position checking are marked in the circuit board 16.

Next, by the control of the main controller 101, the field of view of the image recognition optical system 19 is switched from the upper side to the lower side, where the position recognition of the circuit board 16 mounted on the bonding stage 17 is performed.

Next, after the slide base 18 and the image recognition optical system 19 are moved to specified positions, the position recognition of the electronic component 13 on the tray 14 is performed by the image recognition optical system 19.

Next, after the bonding head 15 and the slide base 18 are moved based on the above recognition results, the bonding head 15 moves down to suck and pick up the electronic component 13 on the tray 14.

Next, the bonding head 15 and the image recognition optical system 19 are moved to specified positions, and the field of view of the image recognition optical system 19 is switched to the upper side, performing the position recognition of the electronic component 13 sucked up to the bonding head 15. Then, by taking into consideration the image recognition results of the circuit board 16 and the electronic component 13 as well as the calibration result of the image recognition optical system 19 (i.e., the optical-axis shift amount for calibration use), the position correction between the circuit board 16 and the electronic component 13 is performed. After this, the bonding head 15 moves down to mount the electronic component 13 onto the circuit board 16.

As described above, according to this first embodiment, measurement of the optical-axis shift amount (offset amount) between the fields of view of the image recognition optical system 19 is repeatedly performed a plurality of times during the calibration operation. A measured value selected from among the measured values of the plurality of measurements or a mean value of those measured values is used as an optical-axis shift amount of calibration use. Thus, while the degree of effect of the handling precision of the jig 21 is suppressed, the optical-axis shift amount between the lower-side field of view and the upper-side field of view of the image recognition optical system 19 can be determined with high precision. Therefore, any shift of the mounting position of the electronic component 13 relative to the circuit board 16 can be suppressed.

In this first embodiment, after a position recognition operation of the marking 22 of the jig 21 on the calibration stage 20 is performed at step S1, another position recognition operation of the marking 22 of the jig 21 sucked up by the nozzle 15a of the bonding head 15 is performed at steps S2 and S3. However, it is also possible that, conversely, after the operation of steps S2 and S3 is performed, the operation of step S1 is performed.

As shown above, according to the present invention, the optical-axis shift amount (offset amount) between the fields of view of the image recognition optical system is determined a plurality of times, and then based on the optical-axis shift amounts of the plurality of times of measurement, an optical-axis shift amount for calibration use is determined, for example, by taking a mean value of those values. Thus, while the degree of effect of the handling precision of the jig in determining the optical-axis shift amount for calibration use is suppressed, the offset amount (optical-axis shift amount) between the lower-side field of view and the upper-side field of view of the image recognition optical system can be determined with high precision so that any shift of the mounting position of a component relative to the member onto which the component should be mounted can be suppressed.

Furthermore, in this first embodiment, when the measurement of the optical-axis shift amount is performed only once, for example, before the start of the mounting operation, there are some cases where some distortion occurs to the holding portion of the image recognition optical system due to changes in the room temperature or heat generation inside the apparatus during the mounting operation, causing the inclination of the optical axis to change. Thus, the mounting position of the component is shifted and causes a malfunction. Accordingly, to prevent this occurrence, it is preferable that, after the shift optical-axis shift amount is measured once as described above, a similar measurement is done after an elapse of another specified time, for example, two hours, and an offset of the optical-axis shift amount is updated based on the measurement result.

This is explained more concretely with respect to a mounting operation of the electronic component 13. First, after the head 15 and the slide base 18 have moved to specified positions, the head 15 moves down to pick up the electronic component 13 on the tray 14. Subsequently, the head 15 and the slide base 18 move again so that a coarse positioning for mounting the electronic component 13 onto the circuit board 16 is performed. Subsequently, for checking the position of the circuit board 16, the image recognition optical system 19 moves to such a position as to bring a feature point such as a recognition mark on the circuit board 16 into the field of view, performing image recognition of the feature point by the image recognizing section 107. Next, for checking the position of the electronic component 13, the image recognition optical system 19 moves to such a position as to bring the feature point such as a recognition mark on the electronic component 13 into the field of view, performing image recognition of the feature point by the image recognizing section 107. Then, position correction between the circuit board 16 and the electronic component 13 is performed based on the image recognition results of the circuit board 16 and the electronic component 13 and the latest calibration result of the image recognition optical system 19 which are stored in the memory 113. After that, the head 15 moves down to mount the electronic component 13 onto the circuit board 16.

As shown above, according to this first embodiment, the position correction during the electronic component mounting operation is implemented by an amount of offset between the field of view on the electronic-component image recognition side and the field of view on the circuit-board image recognition side measured and updated in the memory 113 at intervals of a specified time, for example, two hours. As a result, the mounting position of the electronic component will never be shifted even if the inclination of the optical axis has changed because of an occurrence of distortion to the holding portion of the image recognition optical system due to changes in the room temperature or heat generation inside the apparatus.

With the electronic component mounting apparatus and method of the present invention, as apparent from the foregoing description, the offset amount between the fields of view of the image recognition optical system is measured at regular time intervals and the correction of the image recognition results of the electronic component and the circuit board is made based on the measurement results. Thus, it becomes possible to achieve a position correction free from any distortion of the holding portion of the image recognition optical system during the electronic component mounting operation. Therefore, the electronic component can be mounted with high precision even upon occurrence of changes in the room temperature or heat generation inside the apparatus.

Hereinbelow, an electronic component mounting apparatus and method according to a second embodiment of the present invention are described with reference to the accompanying drawings.

Figure 8:
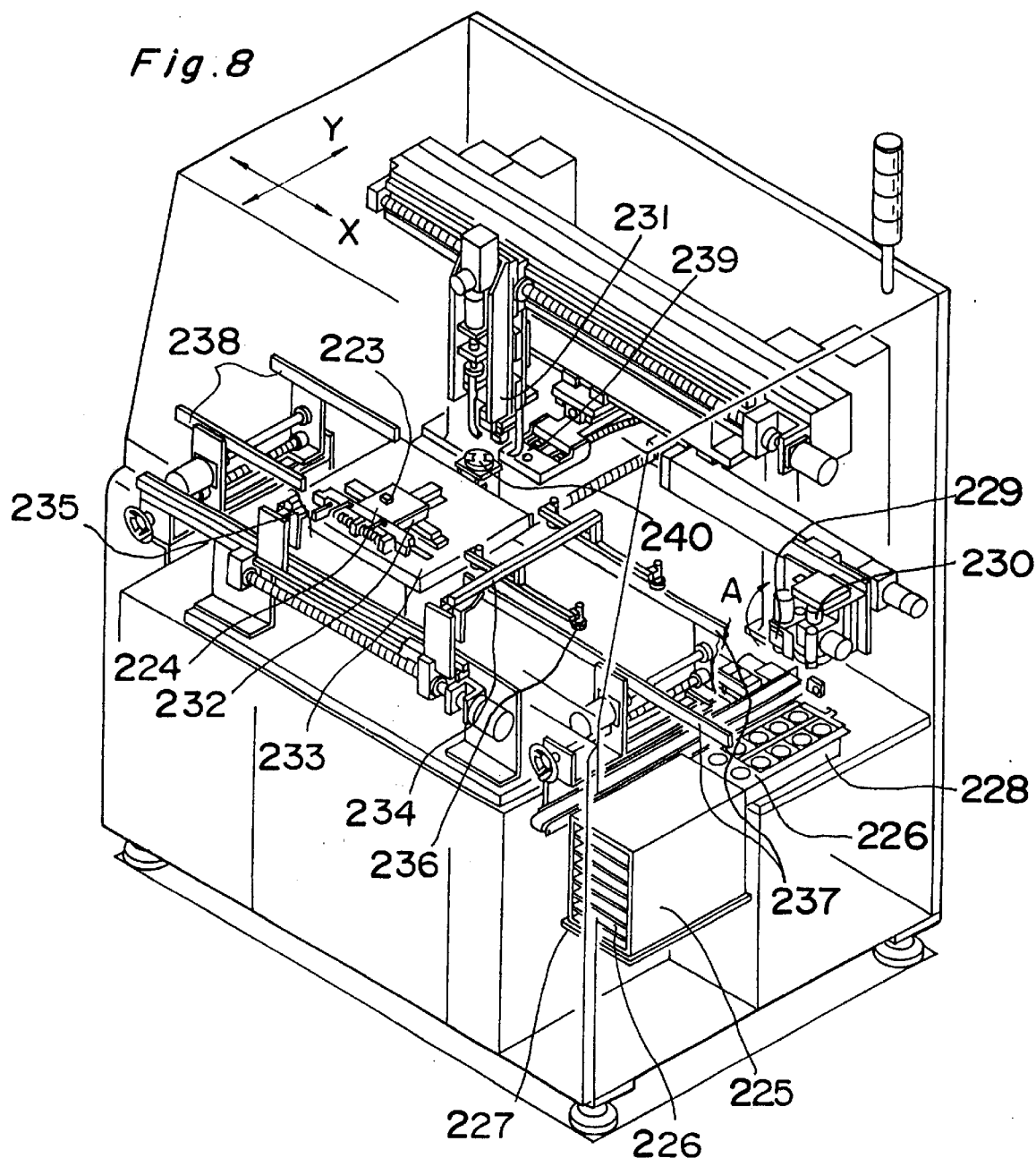
FIG. 8 is a perspective view showing the overall arrangement of an electronic component mounting apparatus according to a second embodiment of the present invention.
Figure 9:
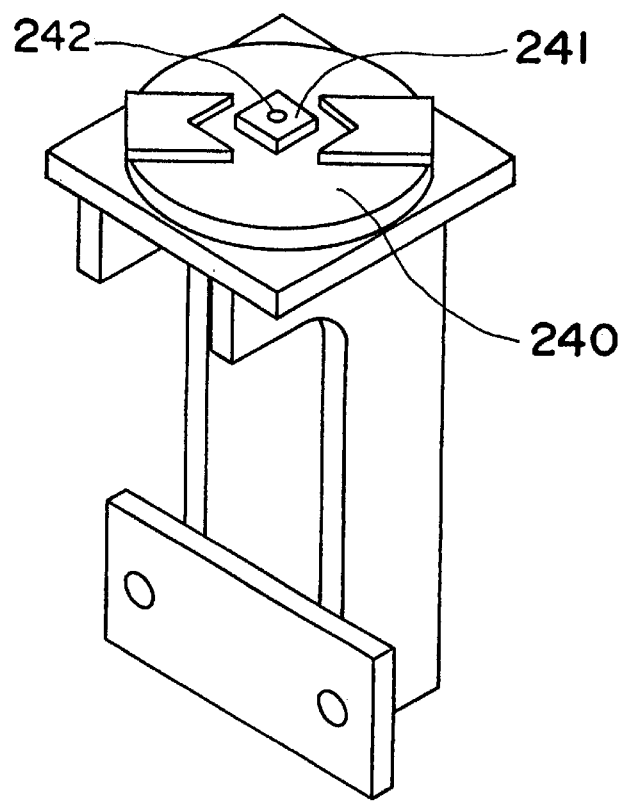
FIG. 9 is a perspective view of the calibration stage provided in the electronic component mounting apparatus.

FIG. 8 is a perspective view of an electronic component mounting apparatus as an example of the component mounting apparatus. FIG. 9 is a perspective view of the stage for calibration of the image recognition optical system provided in the electronic component mounting apparatus. Referring to FIG. 8, reference numeral 223 denotes an electronic component, as an example of the component, which is mounted on a circuit board 224 as an example of a member to which the component should be mounted. Reference numeral 225 denotes a storage magazine, in which a plurality of tray plates 226 are set up, where a plurality of electronic components 223 prior to the mounting to the circuit board 224 are stored on the tray plates 226. Reference numeral 227 denotes a lifter, which performs lifting and lowering operations of the storage magazine 225. Reference numeral 228 denotes a drawing unit which can move forward and backward in a Y direction and can clamp the tray plates 226, thus performing a drawing operation of a tray plate 226 to the storage magazine 225. Reference numeral 229 is a reversal head which can move up and down, and can pick up the electronic component 223 on the tray plate 226 by vacuum suction. Also, the reversal head 229 can move in an X direction perpendicular to the Y direction and can turn 180° in an A direction. Reference numeral 230 denotes a recognition camera, which can check the position of the electronic component 223 on the tray plate 226 and which moves in the X direction together with the reversal head 229. Reference numeral 231 denotes a bonding head as an example of a component holding and conveying device, the bonding head 231 being able to move in the X direction and move up and down along an up-and-down direction perpendicular to both X and Y directions, and can pick up the electronic component 223, which has been sucked up and held to the reversal head 229, from the reversal head 229 by vacuum suction and then mount the electronic component 223 onto the circuit board 224.

Figure 14:
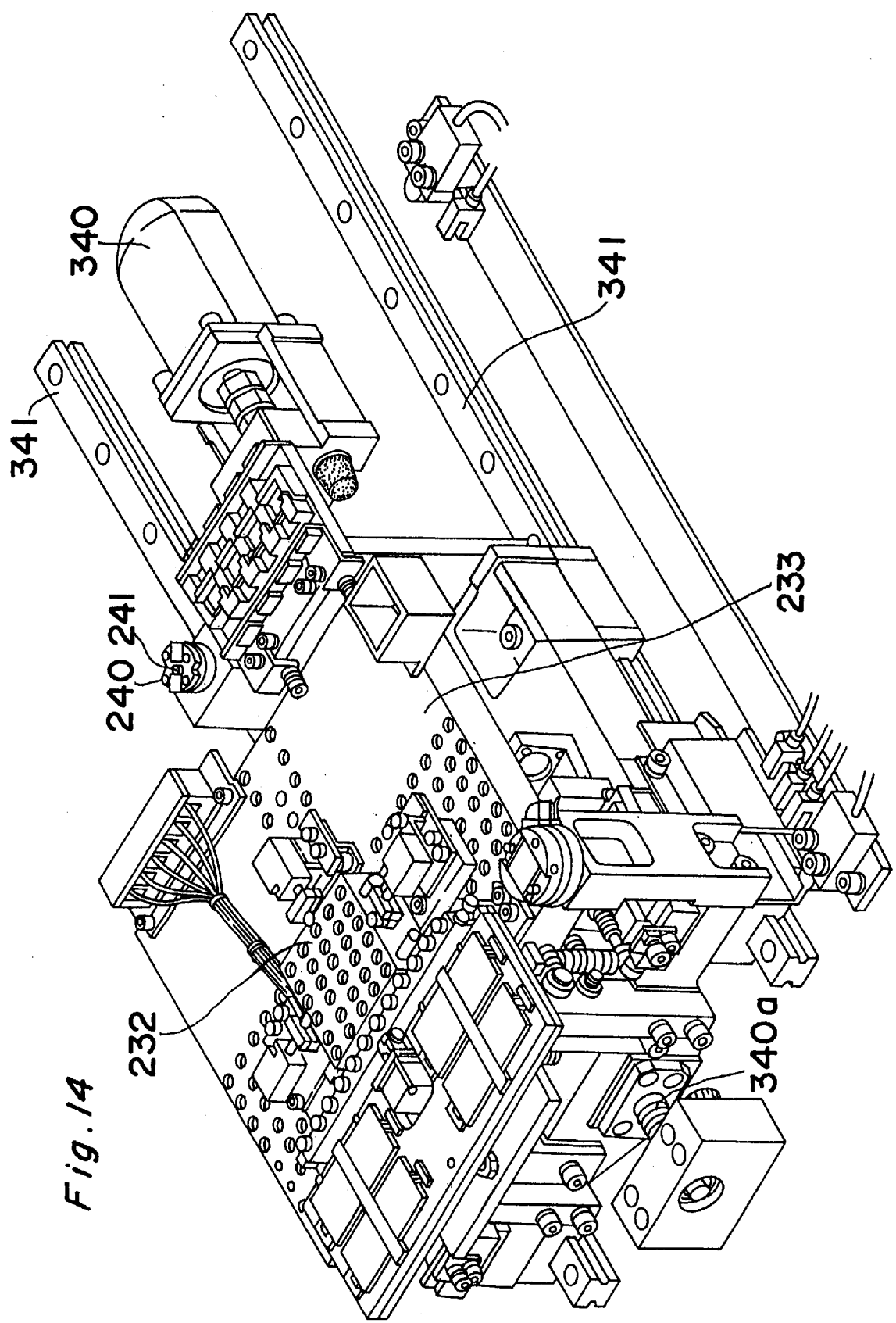
FIG. 14 is a perspective view showing a slide base moving device of the electronic component mounting apparatus of the second embodiment of the invention.

Reference numeral 232 denotes a bonding stage, as an example of a circuit-board holding device, which sucks up and holds the circuit board 224. Then, the bonding stage 232 is fixed on a slide base 233. The slide base 233 can move in the Y direction under the guide of guide members 341, 341 by rotationally driving a ball screw 340a with a servo motor 340 shown in FIG. 14. Reference numerals 234, 235 denote conveyor arms, each as an example of a circuit-board conveying device, which are equipped with four suction pads 236 at the tip of each of the conveyor arms 234, 235, and which can move up and down and can move in the X direction. The tip portion of the conveyor arm 235, although not shown in the figure, has a construction similar to the conveyor arm 234. The conveyor arm 234 can suck up and convey the circuit board 224, which has been conveyed up by a pair of loader conveyors 237, with the four suction pads 236 and then mount the circuit board 224 onto the bonding stage 232. Further, the conveyor arm 235 can transfer the circuit board 224 placed on the bonding stage 232 to a pair of unloader conveyors 238 with four suction pads.

Figure 15:
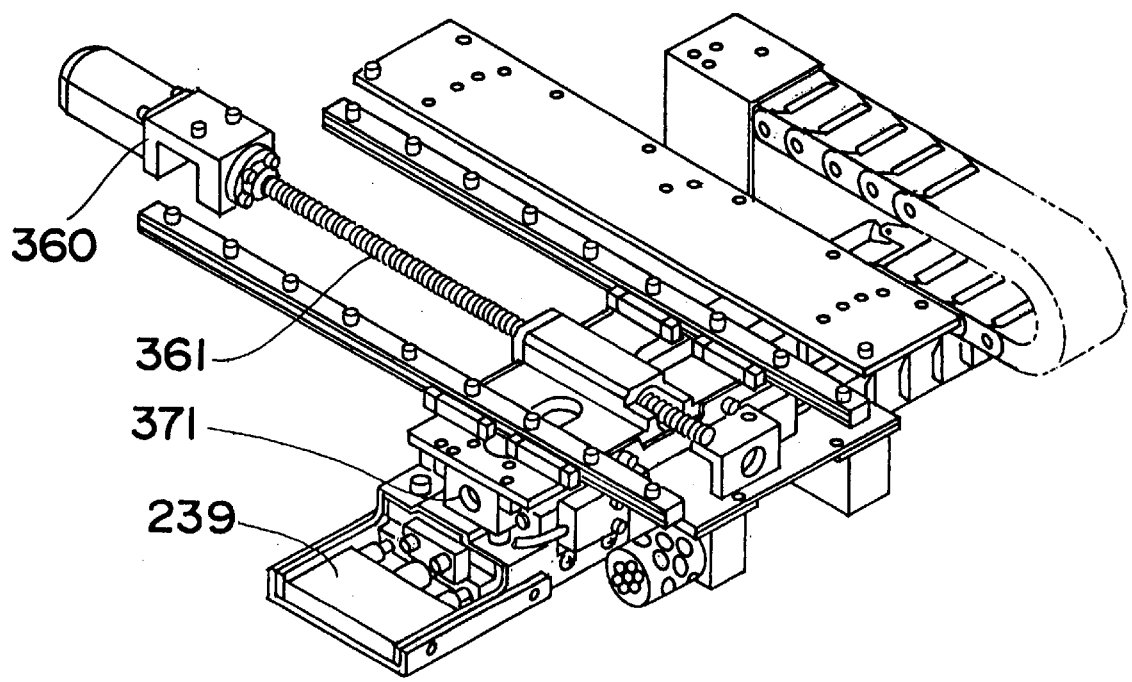
FIG. 15 is a perspective view showing the image-recognition-optical-system moving device of the electronic component mounting apparatus of the second embodiment of the invention.
Figure 16:
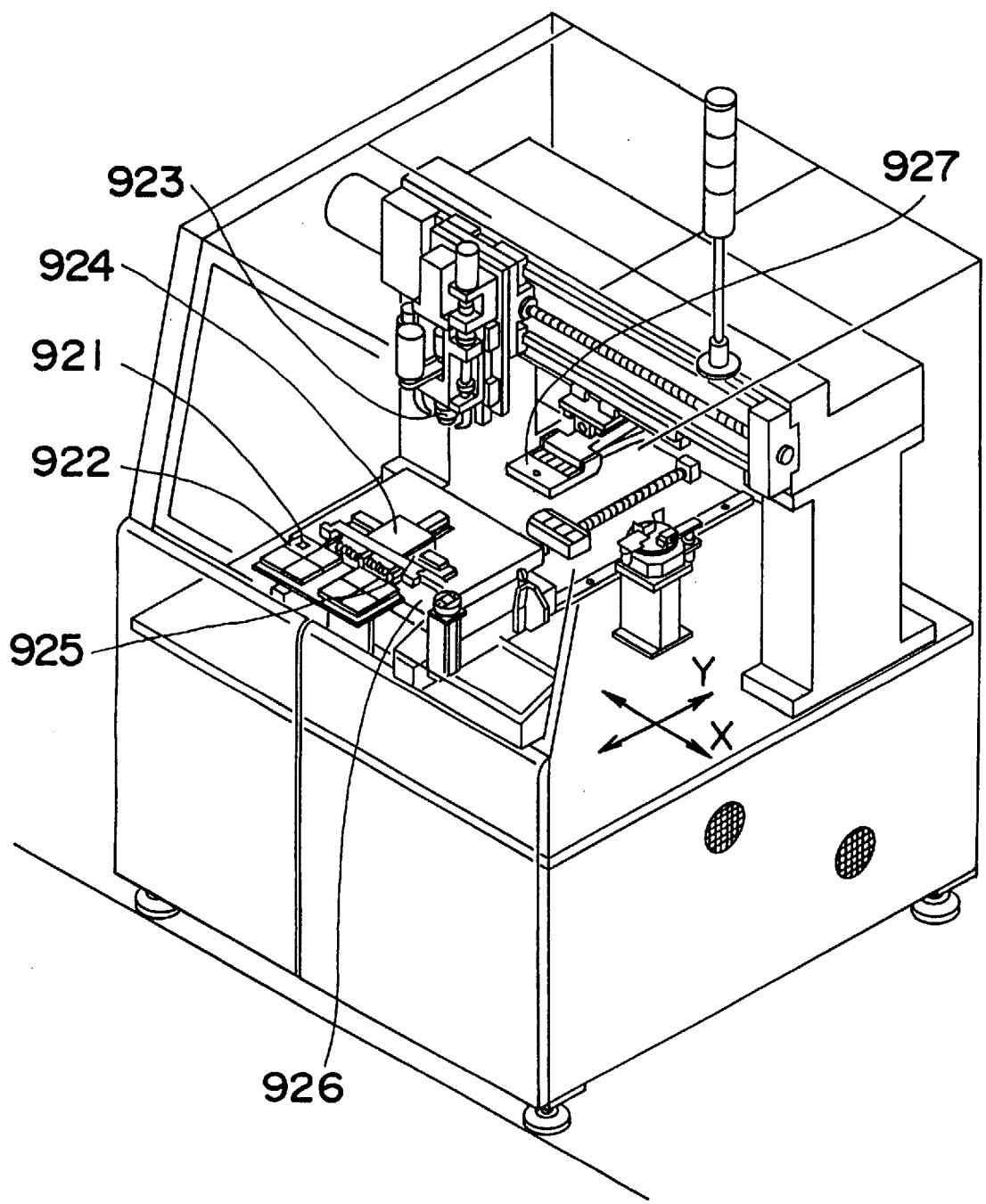
FIG. 16 is a perspective view showing the overall arrangement of an electronic component mounting apparatus according to the prior art.
Figure 17:
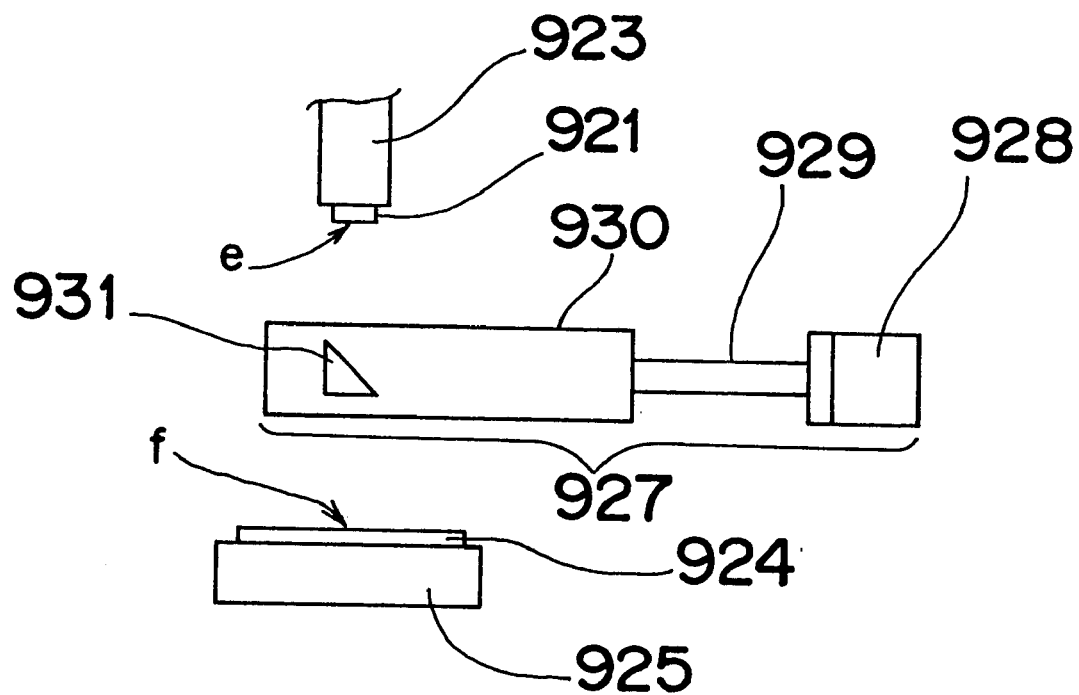
FIG. 17 is a longitudinal side view of the image recognition optical system of the prior art apparatus.

Reference numeral 239 denotes an image recognition optical system, which can recognize the position of the circuit board 224 located below the image recognition optical system 239 and the position of the electronic component 223 located above the image recognition optical system 239 through the switching of the field of view. Also, the image recognition optical system 239 is movable in both X and Y directions by turning a ball screw 361 with rotation of an X-direction movement motor 360 shown in FIG. 15, and by turning a ball screw 371 with rotation of a Y-direction movement motor hidden below in FIG. 15, respectively. Reference numeral 240 denotes a calibration stage, which is mounted on the slide base 233. The calibration stage 240 is moved integrally by the Y-direction movement of the slide base 233 during the feed of the circuit board, so that a jig 241 for calibration of the image recognition optical system is located at an image-recognizable position for the image recognition optical system 239. In addition, the calibration stage 240 is moved integrally by the Y-direction movement of the slide base 233 during the feed of the circuit board, so that the jig 241 for calibration of the image recognition optical system 239 is located at a pickup-enabled position for the bonding head 231.

Referring to FIG. 9, the jig 241 made of glass for calibration of the image recognition optical system 239 is sucked up and held on the top of the calibration stage 240. Also, a marking 242 for image recognition is marked at a center portion of the jig 241.

Figure 13:
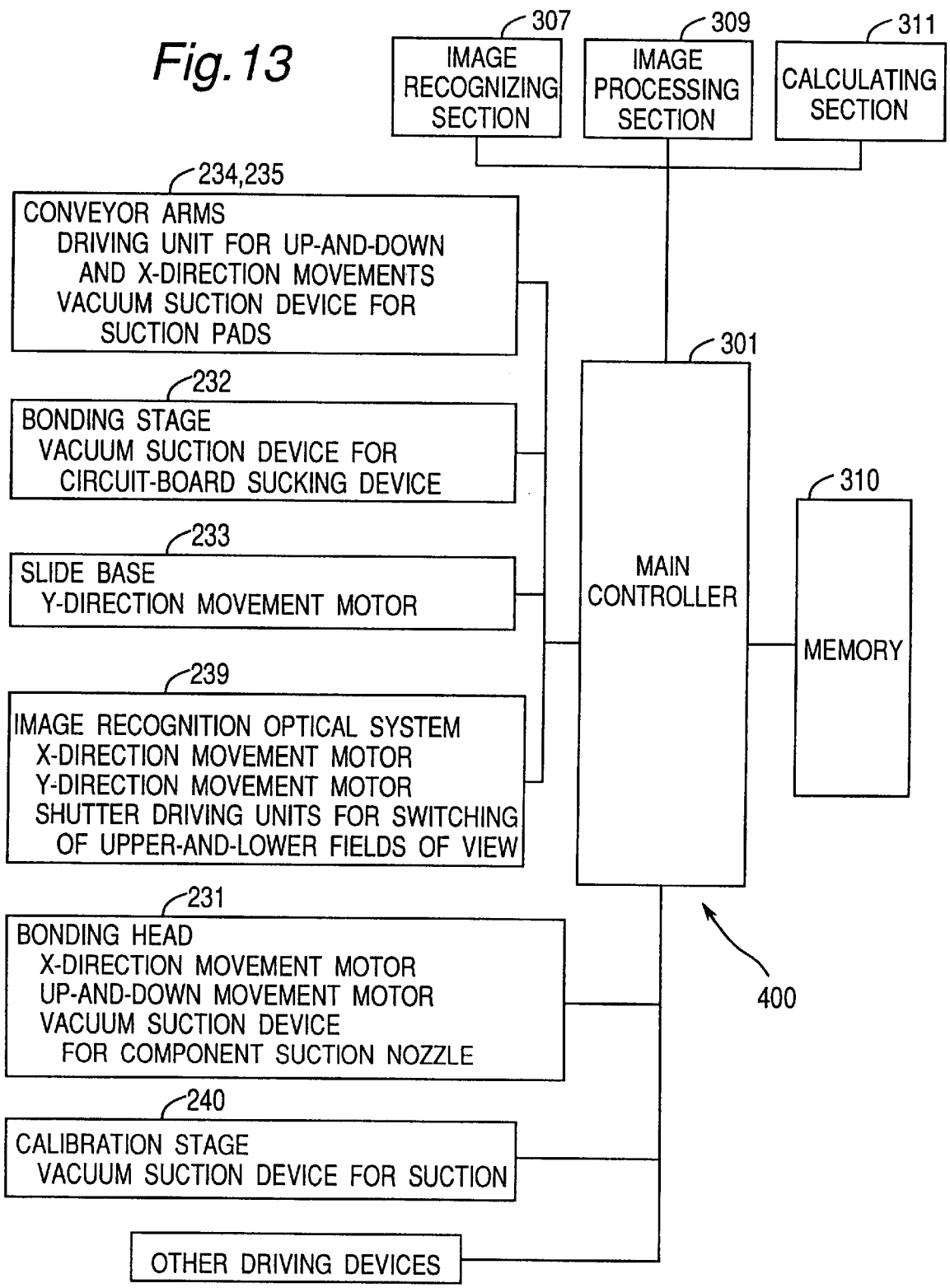
FIG. 13 is a block diagram of the control section of the electronic component mounting apparatus of the second embodiment of the invention.

Various operations of the electronic component mounting apparatus are controlled by a control section 400. This control section 400, as shown in FIG. 13, is equipped with a main controller 301 which outputs operation instructions, calculating instructions and the like according to a concatenated control sequence, and puts data into and out of a memory 310. For the main controller 301 to output the operation instructions and the like and to receive various types of signals, connected to the main controller 301 are driving units and the like for such mechanisms as the conveyor arms 234, 235, the bonding stage 232, the bonding head 231, the slide base 233, the calibration stage 240, the loader and unloader conveyors 237, 238, the image recognition optical system 239, the reversal head 229, the drawing unit 228, and the lifter 227, so that these members are operation-controlled by the main controller 301, respectively. More specifically, the members connected to the main controller 301 include: a driving unit for up-and-down and X-direction movements of the conveyor arms 234, 235 and a vacuum suction device for the suction pads 236 of the arms 234, 235; a vacuum suction device for suction of the circuit board 224 by the bonding stage 232; a Y-direction movement motor for the slide base 233; an X-direction movement motor, a Y-direction movement motor, and shutter driving units for switching of the upper-and-lower fields of view for the image recognition optical system 239; the memory 310 for storing various types of data; an image recognizing section 307 for capturing the marking 242 of the jig 241 for calibration by the image recognition optical system 239 as image data and making the image data stored in the memory 310; an image processing section 309 for processing the image captured by the image recognizing section 307 and stored in the memory 310; a calculating section 311 for calculating an optical-axis shift amount between the upper-and-lower fields of view after the image processing by the image processing section 309, and then storing calculation results into the memory 310; an X-direction movement motor, an up-and-down movement motor, and a vacuum suction device for suction of the component suction nozzle for the bonding head 231; and a vacuum suction device for suction of the calibration stage 240. It is noted that the other drivers are omitted in the figure.

Figure 11:
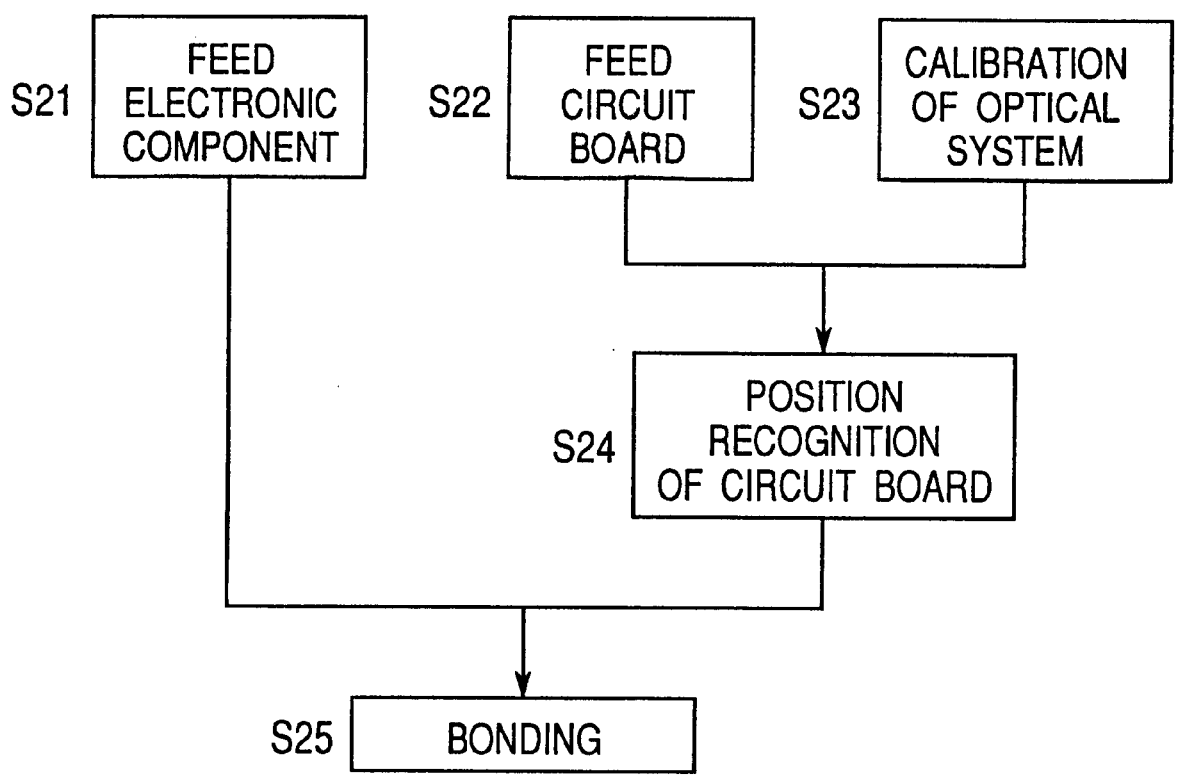
FIG. 11 is a flow chart showing the operation of the electronic component mounting apparatus.

With respect to the electronic component mounting apparatus constructed as described above, its operation is now explained with reference to FIG. 11. The following operations are executed under the control of the main controller 301.

First, a feeding operation of the electronic component 223 (step S21 in FIG. 11) is executed. This operation is detailed below. The lifter 227 moves up or down so as to come to a specified height for drawing out the tray plate 226. Subsequently, the tray plate 226 set in the storage magazine 225 is clamped and drawn out by the drawing unit 228. Subsequently, the position of the electronic component 223 on the tray plate 226 is checked by the recognition camera 230. Subsequently, based on the position checking results, the drawing unit 228 and reversal head 229 are moved so that the electronic component 223 can be picked up by the reversal head 229. Then, the reversal head 229 moves down to pick up the electronic component 223. Subsequently, the reversal head 229 turns 180° in the A direction and moves in the X direction to a position where the electronic component 223 can be delivered to the bonding head 231.

While the sequential operation for feeding the electronic component 223 with the reversal head 229 is carried out, a feeding operation of the circuit board 224 (step S22 in FIG. 11), a calibration operation of the image recognition optical system 239 (step S23 in FIG. 11), and a position recognition operation of the circuit board 224 (step S24 in FIG. 11) are also carried out. The feeding operation of the circuit board 224 (step S22) and the calibration operation of the image recognition optical system 239 (step S23) are carried out concurrently. After both operations have been completed, the position recognition operation of the circuit board 224 (step S24) is carried out.

First, the feeding operation of the circuit board 224 (step S22) is explained. The circuit board 224 is first conveyed by the pair of loader conveyors 237 from the right of the electronic component mounting apparatus of FIG. 8 to a position where the circuit board 224 can be picked up by the conveyor arm 234. Subsequently, the conveyor arm 234 moves in the X direction for pickup of the circuit board 224, and then moves down to suck up and hold the circuit board 224 with the four suction pads 236, thus picking up the circuit board 224. Subsequently, the conveyor arm 234 moves in the X direction, and mounts onto the bonding stage 232 the circuit board 224 sucked up and held by the suction pads 236. Also, if any circuit board 224 over the mounting of all the electronic components 223 is left on the bonding stage 232, the operation of conveying out the circuit board 224 to the pair of unloader conveyors 238 by using the conveyor arm 235 is concurrently carried out with the feeding operation of the circuit board 224. During this process, the slide base 233 is located at the position of the origin on the Y-direction movement axis of the ball screw 340a driven by the servo motor 340.

Next, the calibration operation of the image recognition optical system 239 (step S23) is explained. The image recognition optical system 239 moves in the X direction and/or the Y direction so that the marking 242 of the jig 241 on the calibration stage 240 mounted on the slide base 233 becomes recognizable for the image recognition optical system 239. In this process, the slide base 233, which does not need to move, is located at the position of the origin of the Y-direction movement axis. Subsequently, the image recognition optical system 239 is switched to the lower-side field of view, and performs the position recognition of the marking 242 of the jig 241 mounted on the calibration stage 240. The recognized image is stored in the memory 310, and the position of the marking 242 is calculated by the image processing section 309 based on this image and stored in the memory 310. Subsequently, the image recognition optical system 239 withdraws backward (obliquely upward and rightward in FIG. 8), and then the bonding head 231 moves down to pick up the jig 241 by suction. Subsequently, the image recognition optical system 239 is switched to the upper-side field of view, and moves forward (obliquely downward and leftward in FIG. 8), performing the position recognition of the marking 242 of the jig 241 once again. The jig 241 is made of glass and pervious to light, so that the same marking 242 can be recognized by the respective fields of view. Therefore, the position recognition of the marking 242 of the jig 241 held by the bonding head 231 is performed, and the recognized image is stored in the memory 310. Furthermore, the position of the marking 242 is calculated by the image processing section 309 and stored in the memory 310. Subsequently, the image recognition optical system 239 withdraws backward, and then the bonding head 231 moves down to mount the jig 241 onto the calibration stage 240. Then, based on the respective recognition results stored in the memory 310, an optical-axis shift amount (offset amount) between the fields of view of the image recognition optical system 239 is determined by the calculating section 311. This is described in detail with reference to FIG. 10.

Figure 10:
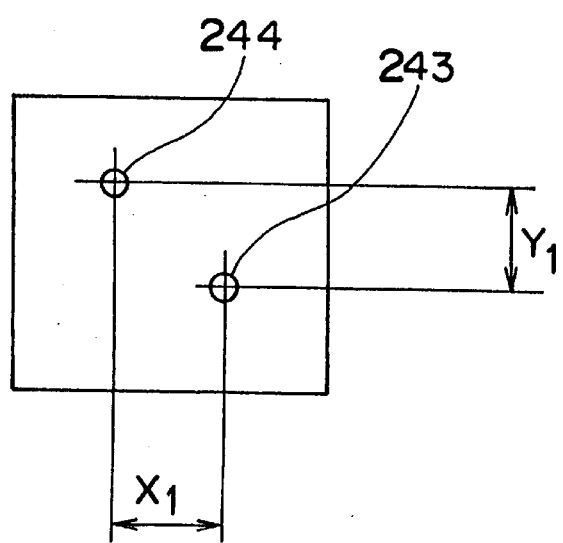
FIG. 10 is a view representing an image taken by the image recognition optical system provided in the electronic component mounting apparatus.

FIG. 10 represents a position of the marking 242 of the jig 241 captured by the image recognition optical system 239, where 243 represents a position of the marking resulting from recognizing an image of the marking 242 with the lower field of view, and 244 represents a position of the marking resulting from recognizing an image of the marking 242 with the upper field of view. Distances X2 and Y2 between the marking 243 and the marking 244 in this case represent an optical-axis shift amount (offset amount) between the lower field of view and the upper field of view of the image recognition optical system 239. This optical-axis shift amount would subtly vary due to the occurrence of distortion of the image recognition optical system 239 or the like caused by effects of changes in the environmental temperature around the electronic component mounting apparatus. Unless the optical-axis shift amount stored in the memory 310 of the electronic component mounting apparatus is corrected, there would occur a shift in the mounting position corresponding to the change. Therefore, in order to prevent any shift of the mounting position, the optical-axis shift amount between the fields of view stored in the memory 310 of the electronic component mounting apparatus is updated by the calibration operation.

Neither the feeding operation of the circuit board 224 (step S22) nor the calibration operation of the image recognition optical system 239 (step S23) requires the slide base 233 to be moved, and both operations can be implemented while the slide base 233 is in the position of the origin on the Y-direction movement axis. Therefore, the feeding operation of the circuit board 224 (step S22) and the calibration operation of the image recognition optical system 239 (step S23) can be implemented concurrently.

Figure 12:
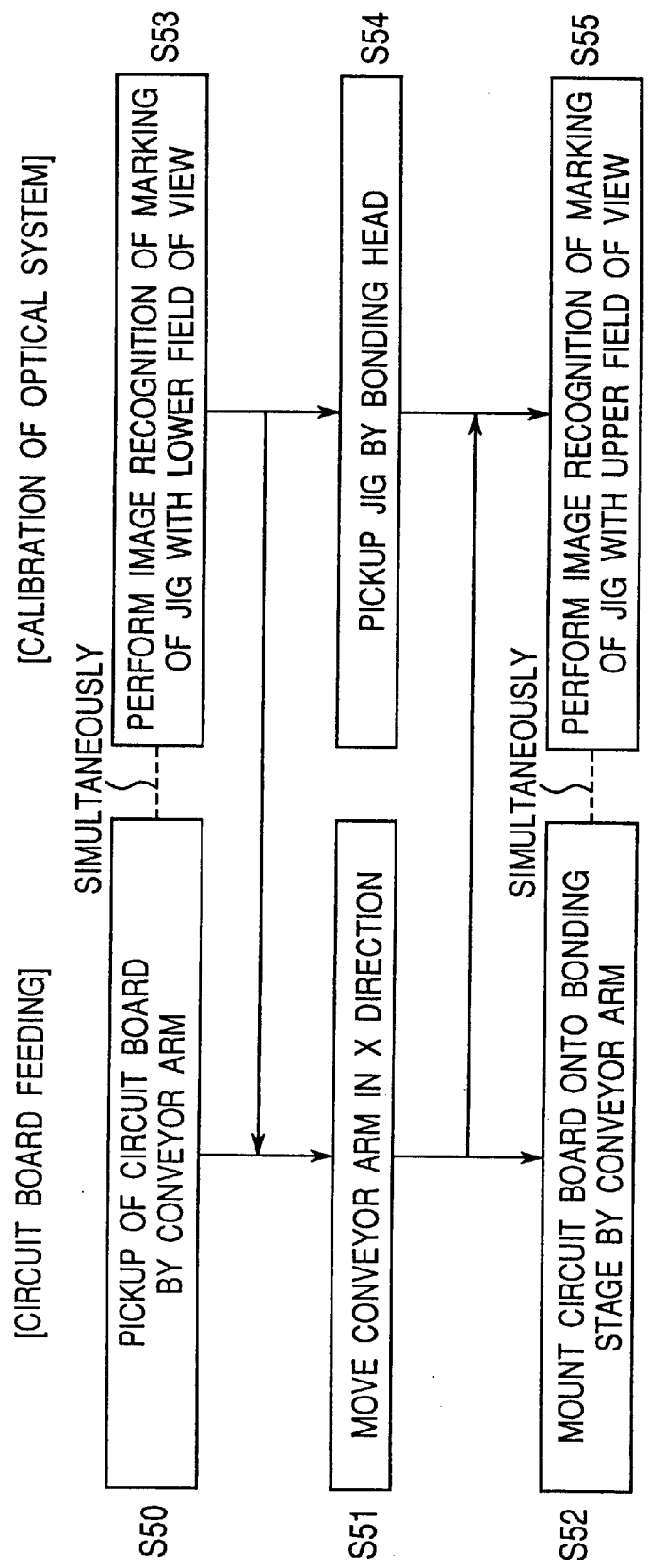
FIG. 12 is a flow chart showing a circuit-board supplying operation and a calibration operation of the image recognition optical system out of the operation of the electronic component mounting apparatus of the second embodiment of the invention.

However, when the conveyor arms 234, 235 are moved in the X direction, any force is applied to a base 299 of the electronic component mounting apparatus due to acceleration and/or deceleration of the speeds of the conveyor arms 234, 235, so that vibrations occur to the whole electronic component mounting apparatus. When this occurs, the bonding head 231 and the calibration stage 240 are also vibrated by the vibrations of the whole electronic component mounting apparatus. If the image recognition of the marking 242 of the jig 241 is performed at these times, the image would blur, resulting in lowered precision of image recognition and therefore lowered precision of the measurement of the optical-axis shift amount between the upper field of view and the lower field of view, as an issue. This being the case, in this embodiment, it is controlled that, under the control of the control section 400, the conveyor arms 234, 235 start to move in the X direction after the completion of the image recognition of the marking 242 of the jig 241 with the lower field of view in the calibration operation, and the image recognition of the marking 242 of the jig 241 with the upper field of view is performed after the completion of the movement of the conveyor arms 234, 235 in the X direction. In addition, the completion of each operation can be confirmed by, as an example, outputting a completion signal from the operation-completed device to the main controller 301 at the time of the completion of the operation, and then by the main controller 301 receiving the completion signal. After the completion confirmation, a signal for driving the next driving unit may be outputted from the main controller 301 to the next driving unit. A flow chart showing such an operation is shown in FIG. 12. That is, first, while the pickup of the circuit board 224 by the conveyor arms 234, 235 or the conveyor arm 234 is performed at step S50, at the same time, the image recognition of the marking 242 of the jig 241 with the lower field of view is performed at step S53. Subsequently, while the X direction movement of the conveyor arms is performed at step S51, the pickup of the jig 241 by the bonding head 231 is performed at step S54. These operations of step S51 and step S54 do not necessarily need to be performed concurrently, but doing so is preferable for further reduction in the mounting time. Subsequently, while the mounting of the circuit board 224 onto the bonding stage 232 by the conveyor arm 234 is performed at step S52, at the same time, by the image recognition of the marking 242 of the jig 241 with the upper field of view is performed at step S55. In addition, a lateral arrow from right to left under the steps S53 and S50 in FIG. 12 imply that the operation of step S51 is performed after the completion of both the operation of step S50 and the operation of step S53. Also, a lateral arrow from left to right under the steps S51 and S54 in FIG. 12 imply that the operation of step S55 is performed after the completion of both the operation of step S51 and the operation of step S54.

Furthermore, the operation may be either ① or ② as follows. ① After the completion of the image recognition of the marking 242 of the jig 241 with both lower and upper fields of view for the calibration operation, the conveyor arm 234 starts to move in the X direction. ② After the completion of the X direction movement of the conveyor arm 234, the image recognition of the marking 242 of the jig 241 with the lower field of view is started. In addition, the completion of each operation can be confirmed by, as an example, outputting a completion signal from the operation-completed device to the main controller 301 at the time of the completion of the operation, and then by the main controller 301 receiving the completion signal. After the completion confirmation, a signal for driving the next driving unit may be outputted from the main controller 301 to the driving unit.

Next, the position recognition operation of the circuit board 224 (step S24 in FIG. 11) is explained. First, in order that the image recognition optical system 239 can check the position of the circuit board 224 on the bonding stage 232 mounted on the slide base 233, the slide base 233 and the image recognition optical system 239 are moved. For this process, a feature point (e.g., a recognition mark such as x mark) for position-checking is previously marked in the circuit board 224. Subsequently, the field of view of the image recognition optical system 239 is switched to the lower side, where the position recognition of the circuit board 224 mounted on the bonding stage 232 is performed.

After the completion of the operations of steps S21 to S24, a bonding operation (step S25 in FIG. 11) is performed. This operation is explained below. First, the bonding head 231 moves in the X direction, and performs the pickup of the electronic component 223 sucked up to the reversal head 229. Next, the bonding head 231 is moved to a position where the position of the sucked electronic component 223 can be checked by the image recognition optical system 239. Concurrently, the image recognition optical system 239 also moves for the position checking of the electronic component 223. Subsequently, the field of view of the image recognition optical system 239 is switched to the upper side, and the position recognition of the electronic component 223 is performed by the image recognition optical system 239. Then, based on the position recognition result of the electronic component 223 as well as the position recognition result of the circuit board 224 in the position recognition operation of the circuit board 224 (step S24), position correction of the bonding head 231 and the slide base 233 is performed. The bonding head 231 then moves down to mount the electronic component 223 onto the circuit board 224.

As described above, according to this second embodiment, the slide base 233 is located at the position of the origin so that the calibration stage 240 is located at a deep-side end edge of the slide base 233 in the electronic component mounting apparatus, which is a region that will not obstruct the conveying-in and -out operations of the circuit board 224, during the feeding of the circuit board. Therefore, it becomes possible to perform the calibration operation of the image recognition optical system 239 during the process of replacement of circuit boards. As a result, any extension of the mounting time due to the calibration operation of the optical system can be eliminated or such extension of the mounting time can be suppressed.

As shown above, according to the present invention, when the circuit board is held by the circuit-board holding device, the calibration stage on which the jig for use of calibration of the image recognition optical system is to be mounted is placed at a position which is a region outside the conveying-in and -out region for the circuit board and which allows an image of the jig to be recognized by the image recognition optical system. With this and other arrangements, the position recognition for calibration by the image recognition optical system is performed. Thus, it becomes possible to perform the calibration operation of the image recognition optical system during the process of replacement of circuit boards. As a result, any extension of the mounting time due to the calibration operation of the image recognition optical system can be reduced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defines by the appended claims unless they depart therefrom.

What is claimed is:

1. A component mounting apparatus comprising:

a component holding and conveying device for holding and conveying a component and for mounting the component onto a circuit board;

a circuit board holding device for holding the circuit board;

an image recognition optical system for performing position recognition of the circuit board using a first field of view and for performing position recognition of the component using a second field of view, the first field of view being different than the second field of view and both fields of view being imaged using a common image capture device; and a control section for calibrating said image recognition optical system by determining a calibration optical-axis shift amount prior to the component being mounted onto the circuit board, and for controlling said component holding and conveying device and said image recognition optical system calibrated using the calibration optical-axis shift amount so as to mount the component onto the circuit board, said control section being operable to determine the calibration optical-axis shift amount by repeatedly comparing a circuit board calibration position recognized by said image recognition optical system using the first field of view and a component calibration position recognized by said image recognition optical system using the second field of view so as to obtain a plurality of optical-axis shift amounts and then by calculating the calibration optical-axis shift amount using the plurality of optical-axis shift amounts.

2. The apparatus of claim 1, wherein said control section is operable to compare the circuit board calibration position recognized by said image recognition optical system using the first field of view and the component calibration position recognized by said image recognition optical system using the second field of view so as to obtain at least three optical-axis shift amounts, and to calculate the calibration optical-axis shift amount by:

excluding an upper-limit optical-axis shift amount and a lower-limit optical-axis shift amount from the at least three optical-axis shift amounts;

if a plurality of shift amounts remain after excluding the upper-limit optical-axis shift amount and the lower-limit optical-axis shift amount, then determining the calibration optical-axis shift amount by calculating a mean value of the plurality of remaining shift amounts; and if only one shift amount remains after excluding the upper-limit optical-axis shift amount and the lower-limit optical-axis shift amount, then determining the calibration optical-axis shift amount as the one remaining shift amount.

3. The apparatus of claim 1, wherein said control section is operable to compare the circuit board calibration position recognized by said image recognition optical system using the first field of view and the component calibration position recognized by said image recognition optical system using the second field of view so as to obtain at least three optical-axis shift amounts, and to calculate the calibration optical-axis shift amount by:

excluding outer-limit optical-axis shift amounts from the at least three optical-axis shift amounts, wherein an outer-limit optical-axis shift amount is defined as any shift amount that differs from any remaining of the at least three optical-axis shift amounts by more than a predetermined threshold value; and determining the calibration optical-axis shift amount by calculating a mean value of the remaining shift amounts after excluding any outer-limit optical-axis shift amounts.

4. The apparatus of claim 1, wherein said control section is operable to repeatedly perform a comparison process to determine the plurality of optical-axis shift amounts, wherein during each comparison process, said image recognition optical system is operable to repeatedly perform position recognition of the circuit board calibration position using the first field of view so as to capture a plurality of circuit board calibration position images, and is operable to repeatedly perform position recognition of the component calibration position using the second field of view so as to capture a plurality of component calibration position images, said control section being operable to determine the calibration optical-axis shift amount by:

comparing the plurality of circuit board calibration position images and the plurality of component calibration position images captured during each comparison process so as to obtain the plurality of optical-axis shift amounts; and calculating the calibration optical-axis shift amount using the plurality of optical-axis shift amounts.

5. The apparatus of claim 1, wherein said control section is operable to obtain the plurality of optical-axis shift amounts by repeatedly comparing the circuit board calibration position recognized by said image recognition optical system using the first field of view and the component calibration position recognized by said image recognition optical system using the second field of view at specified time intervals.

6. A component mounting apparatus comprising:

a component holding and conveying device for holding and conveying a component and for mounting the component onto a circuit board, said component holding and conveying device having a calibration stage;

a circuit board holding device for holding the circuit board;

an image recognition optical system for repeatedly recognizing a first position of a marking on a jig using a first field of view while holding the jig on said calibration stage, and for repeatedly recognizing a second position of the marking on the jig using a second field of view while holding the jig on said component holding and conveying device, the first field of view being different than the second field of view and both fields of view being imaged using a common image capture device; and a control section for calibrating said image recognition optical system by determining a calibration optical-axis shift amount prior to the component being mounted onto the circuit board, and for controlling said component holding and conveying device and said image recognition optical system calibrated using the calibration optical-axis shift amount so as to mount the component onto the circuit board, said control section being operable to determine the calibration optical-axis shift amount by repeatedly comparing the first position repeatedly recognized by said image recognition optical system using the first field of view and the second position repeatedly recognized by said image recognition optical system using the second field of view so as to obtain a plurality of optical-axis shift amounts and then by calculating the calibration optical-axis shift amount as the mean value of the plurality of optical-axis shift amounts.

7. The apparatus of claim 6, wherein said image recognition optical system is operable to perform a recognition process by recognizing the first position of the marking on the jig one time while holding the jig on said calibration stage and then by recognizing the second position of the marking on the jig one time while holding the jig on said component holding and conveying device, and said image recognition optical system being operable to repeat the recognition process a plurality of times so as to repeatedly recognize the first position and the second position of the jig.

8. The apparatus of claim 6, wherein said image recognition optical system is operable to recognize the first position of the marking on the jig a plurality of times while holding the jig on said calibration stage and then recognize the second position of the marking on the jig a plurality of times while holding the jig on said component holding and conveying device so as to repeatedly recognize the first position and the second position of the jig.

9. The apparatus of claim 6, wherein said image recognition optical system is operable to recognize the first position of the marking on the jig at least three times while holding the jig on said calibration stage, and is operable to recognize the second position of the marking on the jig at least three times while holding the jig on said component holding and conveying device, whereby said control section obtains at least three optical-axis shift amounts, said control section being operable to calculate the calibration optical-axis shift amount by:

excluding an upper-limit optical-axis shift amount and a lower-limit optical-axis shift amount from the at least three optical-axis shift amounts;

if a plurality of shift amounts remain after excluding the upper-limit optical-axis shift amount and the lower-limit optical-axis shift amount, then determining the calibration optical-axis shift amount by calculating a mean value of the plurality of remaining shift amounts; and if only one shift amount remains after excluding the upper-limit optical-axis shift amount and the lower-limit optical-axis shift amount, then determining the calibration optical-axis shift amount as the one remaining shift amount.

10. The apparatus of claim 6, wherein said image recognition optical system is operable to recognize the first position of the marking on the jig at least three times while holding the jig on said calibration stage, and is operable to recognize the second position of the marking on the jig at least three times while holding the jig on said component holding and conveying device, whereby said control section obtains at least three optical-axis shift amounts, said control section being operable to calculate the calibration optical-axis shift amount by:

excluding outer-limit optical-axis shift amounts from the at least three optical-axis shift amounts, wherein an outer-limit optical-axis shift amount is defined as any shift amount that differs from any remaining of the at least three optical-axis shift amounts by more than a predetermined threshold value; and determining the calibration optical-axis shift amount by calculating a mean value of the remaining shift amounts after excluding any outer-limit optical-axis shift amounts.

11. A component mounting apparatus comprising:

a component holding and conveying device for holding and conveying a component and for mounting the component onto a circuit board;

a circuit board holding device for holding the circuit board;

an image recognition optical system for performing position recognition of the circuit board using a first field of view and for performing position recognition of the component using a second field of view, the first field of view being different than the second field of view and both fields of view being imaged using a common image capture device; and a control section for calibrating said image recognition optical system by determining a calibration optical-axis shift amount prior to the component being mounted onto the circuit board, and for controlling said component holding and conveying device and said image recognition optical system calibrated using the calibration optical-axis shift amount so as to mount the component onto the circuit board, said control section being operable to determine the calibration optical-axis shift amount by comparing a circuit board calibration position recognized by said image recognition optical system using the first field of view and a component calibration position recognized by said image recognition optical system using the second field of view, said control section being further operable to calibrate said image recognition optical system when the circuit board is being held by said circuit board holding device.

12. The apparatus of claim 11, further comprising a calibration stage for supporting a jig for calibration of said image recognition optical system and for moving the jig such that the jig can be recognized by said image recognition optical system, said image recognition optical system being operable to recognize a position of the jig supported on said calibration stage as the circuit board calibration position;

and said component holding and conveying device being operable to hold the jig for calibration of said image recognition optical system and to move the jig such that the jig can be recognized by said image recognition optical system, said image recognition optical system being operable to recognize a position of the jig held by said component holding and conveying device as the component calibration position.

13. The apparatus of claim 12, wherein said circuit board holding device includes a slide base, said calibration stage being located at an end edge of said slide base so as to avoid obstructing the circuit board when the circuit board is conveyed.

14. The apparatus of claim 11, further comprising a calibration stage for supporting a jig for calibration of said image recognition optical system and for moving the jig such that the jig can be held by said component holding and conveying device, said image recognition optical system being operable to recognize a position of the jig supported on said calibration stage as the circuit board calibration position;

and said component holding and conveying device being operable to hold the jig for calibration of said image recognition optical system and to move the jig such that the jig can be recognized by said image recognition optical system, said image recognition optical system being operable to recognize a position of the jig held by said component holding and conveying device as the component calibration position.

15. The apparatus of claim 11, further comprising a circuit board conveying device for moving the circuit board, wherein said control section is operable to prevent calibration of said image recognition optical system when said circuit board conveying device is moving the circuit board.

16. The apparatus of claim 11, further comprising a circuit board conveying device for moving the circuit board and a calibration stage for supporting a jig for calibration of said image recognition optical system, wherein said control section is operable to:

simultaneously control said circuit board conveying device and said image recognition optical system such that said circuit board conveying device picks up the circuit board while said image recognition optical system performs image recognition of the jig supported on said calibration stage;

thereafter, control said circuit board conveying device so as to move said circuit board conveying device toward said circuit board holding device, and control said component holding and conveying device so as to pick up the jig; and thereafter, simultaneously control said circuit board conveying device and said image recognition optical system such that said circuit board conveying device mounts the circuit board onto said circuit board holding device while said image recognition optical system performs image recognition of the jig held by said component holding device.

17. A component mounting apparatus comprising:

a component holding and conveying device for holding and conveying a component and for mounting the component onto a circuit board, said component holding and conveying device having a calibration stage;

a circuit board holding device for holding the circuit board;

an image recognition optical system for recognizing a first position of a marking on a jig using a first field of view while holding the jig on said calibration stage, and for recognizing a second position of the marking on the jig using a second field of view while holding the jig on said component holding and conveying device, the first field of view being different than the second field of view and both fields of view being imaged using a common image capture device; and a control section for calibrating said image recognition optical system by determining a calibration optical-axis shift amount prior to the component being mounted onto the circuit board, and for controlling said component holding and conveying device and said image recognition optical system calibrated using the calibration optical-axis shift amount so as to mount the component onto the circuit board, said control section being operable to determine the calibration optical-axis shift amount by comparing the first position recognized by said image recognition optical system using the first field of view and the second position recognized by said image recognition optical system using the second field of view so as to obtain the calibration optical-axis shift amount.

18. A component mounting method comprising:

repeatedly recognizing a first position of a marking on a jig through a first field of view using an image recognition optical system to generate first position images while the jig is held by a calibration stage of a circuit board holding device for holding a circuit board;

repeatedly recognizing a second position of the marking on the jig through a second field of view using the image recognition optical system to generate second position images while the jig is held by a component holding and conveying device for holding a component and for mounting the component on a circuit board, the first field of view being different than the second field of view and both fields of view being imaged using a common image capture device;

determining a plurality of optical-axis shift amounts between the first position and the second position using the first position images and the second position images;

calculating a calibration optical-axis shift amount as a mean value of the determined plurality of optical-axis shift amounts;

calibrating the image recognition optical system using the calculated calibration optical-axis shift amount; and mounting the component onto the circuit board using the calibrated image recognition optical system.

19. The method of claim 18, wherein said repeatedly recognizing the first position of the marking and said repeatedly recognizing the second position of the marking comprises:

performing a recognition process by recognizing the first position of the marking on the jig one time while holding the jig on the calibration stage and then by recognizing the second position of the marking on the jig one time while holding the jig on the component holding and conveying device, and repeating said recognition process a plurality of times.

20. The method of claim 18, wherein said repeatedly recognizing the first position of the marking and said repeatedly recognizing the second position of the marking comprises:

recognizing the first position of the marking on the jig a plurality of times while holding the jig on the calibration stage; and after said recognizing of the first position of the marking on the jig a plurality of times, recognizing the second position of the marking on the jig a plurality of times while holding the jig on the component holding and conveying device.

21. The method of claim 18, wherein said repeatedly recognizing the first position of the marking and said repeatedly recognizing the second position of the marking comprises recognizing the first position of the marking on the jig at least three times while holding the jig on the calibration stage and recognizing the second position of the marking on the jig at least three times while holding the jig on the component holding and conveying device, whereby at least three optical-axis shift amounts are determined, said calculating of the calibration optical-axis shift amount comprising:

excluding an upper-limit optical-axis shift amount and a lower-limit optical-axis shift amount from the at least three optical-axis shift amounts;

if a plurality of shift amounts remain after excluding the upper-limit optical-axis shift amount and the lower-limit optical-axis shift amount, then determining the calibration optical-axis shift amount by calculating a mean value of the plurality of remaining shift amounts; and if only one shift amount remains after excluding the upper-limit optical-axis shift amount and the lower-limit optical-axis shift amount, then determining the calibration optical-axis shift amount as the one remaining shift amount.

22. The method of claim 18, wherein said repeatedly recognizing the first position of the marking and said repeatedly recognizing the second position of the marking comprises recognizing the first position of the marking on the jig at least three times while holding the jig on the calibration stage and recognizing the second position of the marking on the jig at least three times while holding the jig on the component holding and conveying device, said calculating of the calibration optical-axis shift amount comprising:

excluding outer-limit optical-axis shift amounts from the determined optical-axis shift amounts, wherein an outer-limit optical-axis shift amount is defined as any shift amount that differs from any remaining of the optical-axis shift amounts by more than a predetermined threshold value; and determining the calibration optical-axis shift amount by calculating a mean value of the remaining shift amounts after excluding any outer-limit optical-axis shift amounts.

23. The method of claim 18, wherein said repeatedly recognizing the first position of the marking and said repeatedly recognizing the second position of the marking comprises repeatedly recognizing the first position and repeatedly recognizing the second position at specified time intervals.

24. A component mounting method comprising:

simultaneously holding a circuit board using a circuit board holding device and recognizing a component calibration position of a component to be held by a component holding and conveying device through a first field of view by using an image recognition optical system;

recognizing a circuit board calibration position of a circuit board to be held by a circuit board holding device through a second field of view by using the image recognition optical system, the first field of view being different than the second field of view and both fields of view being imaged using a common image capture device;

determining a calibration optical-axis shift amount by comparing the component calibration position and the circuit board calibration position;

calibrating the image recognition optical system using the calibration optical-axis shift amount; and mounting the component on the circuit board using the calibrated image recognition optical system.

25. The method of claim 24, further comprising moving a calibration jig supported on a calibration stage when the circuit board is held by the circuit board holding device such that the jig can be recognized by the image recognition optical system.

26. The method of claim 24, further comprising moving a calibration jig supported on a calibration stage when the circuit board is held by the circuit board holding device such that the jig can be held by the component holding and conveying device.

27. The method of claim 24, wherein said recognizing of a component calibration position and said recognizing of a circuit board calibration position is not performed when the circuit board is moved.

28. The method of claim 27, further comprising:

simultaneously picking up the circuit board using a circuit board conveying device while performing image recognition of a calibration jig supported on a calibration stage using the image recognition optical system to determine the circuit board calibration position;

thereafter, moving the circuit board conveying device toward the circuit board holding device, and picking up the calibration jig using the component holding and conveying device; and thereafter, simultaneously mounting the circuit board onto the circuit board holding device using the circuit board conveying device while performing image recognition of the calibration jig held by the component holding device using the image recognition optical system to determine the component calibration position.

* * * * *